(12) United States Patent
Funatsu et al.

(10) Patent No.: US 7,157,207 B2
(45) Date of Patent: Jan. 2, 2007

(54) POLYMER, RESIST MATERIAL AND PATTERNING PROCESSING

(75) Inventors: Kenji Funatsu, Niigata-Ken (JP); Tsunehiro Nishi, Niigata-Ken (JP); Shigehiro Nagura, Niigata-Ken (JP)

(73) Assignee: Shin-etsu Chemical Co., Ltd. (JP)

( * ) Notice: Subject to any disclaimer, the term of this patent is extended or adjusted under 35 U.S.C. 154(b) by 0 days.

(21) Appl. No.: 10/933,013

(22) Filed: Sep. 1, 2004

(65) Prior Publication Data

US 2005/0089796 A1   Apr. 28, 2005

(30) Foreign Application Priority Data

Sep. 3, 2003  (JP) .............................. 2003-311056
May 14, 2004  (JP) .............................. 2004-144569

(51) Int. Cl.
*G03F 7/39* (2006.01)
*G03F 7/30* (2006.01)
*C08F 124/00* (2006.01)
*C08F 134/02* (2006.01)
*C08F 24/00* (2006.01)

(52) U.S. Cl. .................. 430/270.1; 430/326; 430/327; 430/910; 526/266; 526/268; 526/270; 526/281; 526/320

(58) Field of Classification Search ................ 526/266, 526/268, 270, 281, 320; 430/270.1, 326, 430/327, 910
See application file for complete search history.

(56) References Cited

U.S. PATENT DOCUMENTS

| | | | |
|---|---|---|---|
| 6,004,724 A | 12/1999 | Yamato et al. | |
| 6,239,231 B1* | 5/2001 | Fujishima et al. | ........... 525/337 |
| 6,261,738 B1 | 7/2001 | Asakura et al. | |
| 6,280,898 B1* | 8/2001 | Hasegawa et al. | ....... 430/270.1 |
| 6,312,867 B1 | 11/2001 | Kinsho et al. | |
| 6,946,233 B1* | 9/2005 | Nishi et al. | ............... 430/270.1 |
| 2001/0016298 A1* | 8/2001 | Nakanishi et al. | ........ 430/270.1 |
| 2003/0054286 A1* | 3/2003 | Sato et al. | ................ 430/270.1 |
| 2004/0191676 A1* | 9/2004 | Nakao et al. | ............. 430/270.1 |

FOREIGN PATENT DOCUMENTS

| | | | |
|---|---|---|---|
| JP | 9-73173 A | 3/1997 | |
| JP | 9-90637 A | 4/1997 | |
| JP | 9-95479 A | 4/1997 | |
| JP | 9-208554 A | 8/1997 | |
| JP | 9-230588 A | 9/1997 | |

(Continued)

OTHER PUBLICATIONS

JPO English Abstract JP2003-215805, Jul. 2003.*

(Continued)

*Primary Examiner*—Richard L. Schilling
(74) *Attorney, Agent, or Firm*—Lerner, David, Littenberg, Krumholz & Mentlik, LLP

(57) ABSTRACT

Provided is a polymer useful as a base resin of a resist material featuring a high resolution, patterns with less sidewall roughness, practically acceptable etching resistance, and a substantial margin allowed for heat treatment temperature after exposure. The polymer has a weight-average molecular weight of from 1,000 to 50,000 and comprises at least one repeating unit of formula (1) below, at least one repeating unit of formula (2) below and at least one repeating unit of formula (3) below. A resist material comprising the polymer is also provided. In addition, provided is a pattern formation process comprising steps of applying the resist material onto a substrate, heating the film, exposing the heated film through a photomask to high energy radiation or electron beam, heating the exposed film and then developing with a developer

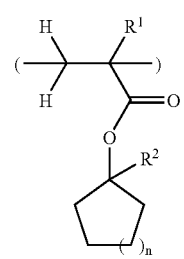

(1)

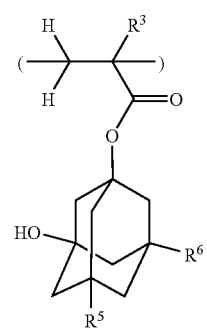

(2)

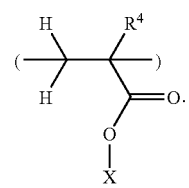

(3)

7 Claims, No Drawings

FOREIGN PATENT DOCUMENTS

| | | | |
|---|---|---|---|
| JP | 9-301948 | A | 11/1997 |
| JP | 2906999 | B2 | 4/1999 |
| JP | 2000-159758 | A | 6/2000 |
| JP | 2000-314956 | A | 11/2000 |
| JP | 2002-336121 | A | 12/2000 |
| JP | 2003-2883 | A | 1/2003 |
| JP | 2003-215805 | * | 7/2003 |
| JP | 2004-115486 | A | 4/2004 |

OTHER PUBLICATIONS

Arimitsu et al., "Sensitivity Enhancement Of Chemical-Amplification-Type Photoimaging Materials By Acetoacetic Acid Derivatives", Journal Of Photopolymer Science and Technology, vol. 8, No. 1, pp. 43-44, 1995.

Kudo et al., "Enhancement Of Senesitivity Of Chemical-Amplification-Type Photoimaging Materials By β-Tosyloxyketone Acetals", Journal Of Photopolymer Science and Technology, vol. 8, No. 1, pp. 45-46, 1995.

Arimitsu et al., "Effect Of Phenolic Hydroxyl Residues On The Improvement Of Acid-Proliferation-Type Photoimaging Materials", Journal Of Photopolymer Science and Technology, vol. 9, No. 1, pp. 29-30, 1996.

* cited by examiner

POLYMER, RESIST MATERIAL AND PATTERNING PROCESSING

CROSS-REFERENCE TO RELATED APPLICATIONS

The present application claims priorities to Japanese Patent Application No. 2003-311056, filed Sep. 3, 2003 and No. 2004-144569, filed May 14, 2004, the disclosures of which are incorporated herein by reference in its entirely.

BACKGROUND OF THE INVENTION

1. Field of the Invention

The present invention relates to (1) a polymer containing specific repeating units, (2) a resist material comprising the polymer, and (3) a patterning process using the resist material.

2. Description of the Related Art

In recent years, along with the trend toward higher integration and higher operation speed of LSI devices, there has been a demand for a finer pattern rule. Under such a situation, deep-ultraviolet lithography is considered promising as next generation microfabrication technology. In particular, photolithography using KrF or ArF excimer laser as a light source is eagerly desired to reach the practical level as a technique indispensable for microfabrication to a feature size of 0.3 μm or less.

Resist materials for KrF excimer laser in fact contain, as a standard base resin, polyhyroxystyrene imparting a practical level of transparency and etching resistance. For resist materials for ArF excimer laser, on the other hand, polymers using a polyacrylic or polymethacrylic acid derivative containing an adamantane structure in the side chain thereof tend to be used as described in Japanese Patent Application Unexamined Publication Nos. 9-73173/1997 and 9-90637/1997. However, few of these polymers exhibit their performance fully.

Although sensitivity and dry etching resistance can be improved to some extent by introducing many adamantane-structure-containing acid reactive groups typified by a 2-alkyl-2-adamanthyl group, the resin as a whole inevitably becomes very adamant and hydrophobic owing to the inflexibility and hydrophobicity of the adamantane structure. Such adamant and highly hydrophobic resist materials may cause peeling of a resist film due to lowering in the substrate adhesion, development defects due to lowering in the affinity with a developer, and deterioration in solubility in an all-purpose resist solvent such as propylene glycol monomethyl ether acetate. In addition, although highly hydrophobic resist materials can persistently keep a film in the unexposed portion and dissolve the film speedily in the over-exposed portion, affinity with a developer is insufficient in a considerably wide exposed portion between the portions so that the film fails to dissolve in a developer, causing swelling of the resist film upon development. As a result, this impairs the resolution or convenience, for example, through adhesion or collapse of patterns, roughening on the side walls of the patterns, or fluctuations in the size due to slight unevenness in the heat treatment temperature after exposure. Since a demand for finer pattern rule is high in future, such a resist material cannot be developed to a practical level. Under such a tendency, there is accordingly a demand for a resist material which has excellent performance in affinity with a developer, sensitivity and resolution and can be of easy use owing to a wide range of processing conditions, while having dry etching resistance enough for practical use.

SUMMARY OF THE INVENTION

The present invention has been made in view of the above-described circumstances. An object of the invention is to provide (1) a polymer useful for a resist material featuring a high resolution, less side wall roughness of patterns, practically acceptable etching resistance, and a substantial margin allowed for heat treatment temperature after exposure, (2) a resist material comprising the polymer as a base resin, and (3) a pattern formation process using the resist material.

The present inventors have proceeded with an extensive investigation with a view to attaining the above-described object. As a result, it has been found that a polymer comprising the repeating units represented by formulas (1) to (3) and having a weight-average molecular weight of from 1,000 to 500,000, which are prepared by the process to be described later, is useful as a resin for a resist material; a resist material comprising said polymer as a base resin has a high resolution, provides less side wall roughness of patterns, has a practically acceptable level of etching resistance and is of easy use because small size fluctuations relative to unevenness in heat treatment temperature after exposure; and this resist material is considerably effective for precise microfabrication.

According to the present invention, there is thus provided a polymer having a weight-average molecular weight of from 1,000 to 50,000 and comprising at least one repeating unit of formula (1), at least one repeating unit of formula (2) and at least one repeating unit of formula (3) wherein formulas (1) to (3) are as follows:

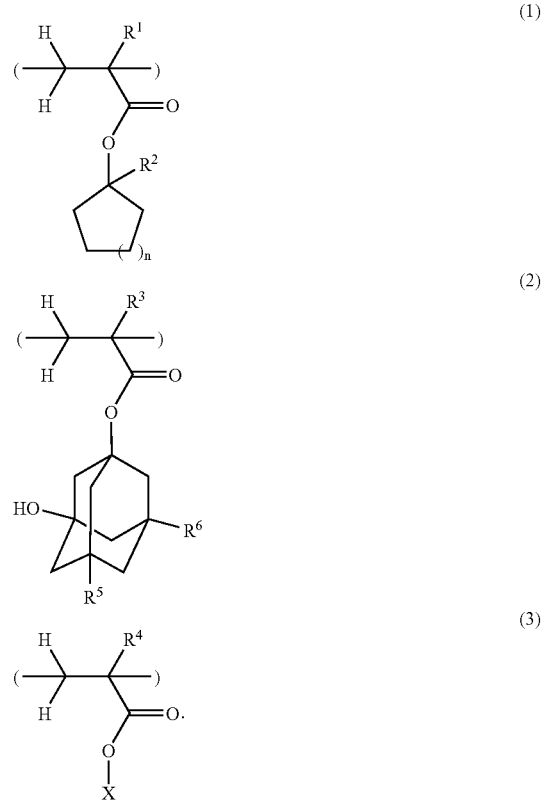

wherein $R^1$, $R^3$ and $R^4$ each independently represents a hydrogen atom or a methyl group; $R^2$ represents a linear, branched or cyclic $C_{1-12}$ alkyl group; $R^5$ and $R^6$ each independently represents a hydrogen atom or a hydroxyl group; X represents a substituent having a lactone structure; and n stands for 1 or 2.

According to the invention, there is also provided a process for forming a pattern, comprising steps of applying the resist material onto a substrate to form a film, heating the film, exposing the heated film through a photomask to high energy radiation or electron beam, heating the exposed film and developing the film with a developer.

As described above, polymers comprising a polyacrylic or polymethacrylic acid derivative containing, in the side chain thereof, an adamantane structure, tend to be used as a resist material. By introducing many adamantane-structure-containing acid reactive groups typified by a 2-alkyl-2-adamantyl group, sensitivity and dry etching resistance can be improved to some extent. Owing to inflexibility and hydrophobicity of the adamantane structure, however, the resin as a whole becomes very adamant and highly hydrophobic. It lowers substrate adhesion and affinity with developer so that development defects and deterioration in solvent solubility are caused. In addition, it causes swelling of the resist film during the development. As a result, because of the adhesion or collapse of patterns and roughening of the side walls of the patterns, such a polymer is not suited for a very fine pattern size for which an ArF excimer laser is employed.

Compared with the polymer comprising as a repeating unit an adamantane-structure-containing acid reactive group typified by a 2-alkyl-2-adamantyl group, the polymer comprising the repeating units represented by formulas (1) to (3) has, as a whole resin, an appropriate solubility in developer; has a high resolution by reducing the undesirable phenomena remarkably such as swelling upon development and pattern collapse; and has sufficient solubility in a solvent and a practical level of dry etching resistance by comprising the repeating unit of formula (2), which is of an adamantane structure having a hydroxyl group. Thus, the polymer is very useful for the formation of fine patterns.

The resist material comprising the polymer of the invention as a base resin can respond to high energy radiation, and have excellent sensitivity, resolution and etching resistance so that it is useful for microfabrication with electron beam or deep UV. Since it shows low absorption at the exposure wavelength of an ArF excimer laser or KrF excimer laser, it can facilitate the formation of patterns which are fine as well as vertical to a substrate.

DETAILED DESCRIPTION OF THE PREFERRED EMBODIMENTS

The invention will hereinafter be described more specifically.

According to the invention, a novel polymer comprises at least one repeating unit of formula (1), at least one repeating unit of formula (2) and at least one repeating unit of formula (3) and having a weight-average molecular weight of from 1,000 to 500,000.

In formulas, $R^1$, $R^3$ and $R^4$ each independently represents a hydrogen atom or a methyl group.

$R^2$ represents a linear, branched or cyclic $C_{1-12}$ alkyl group and may include methyl, ethyl, propyl, isopropyl, n-butyl, sec-butyl, tert-butyl, tert-amyl, n-pentyl, n-hexyl, cyclopentyl and cyclohexyl groups.

$R^5$ and $R^6$ each represents a hydrogen atom or a hydroxyl group. X represents a substituent containing a lactone structure. The letter n stands for 1 or 2.

Specific examples of the repeating unit represented by formula (1) may include, but not be limited to:

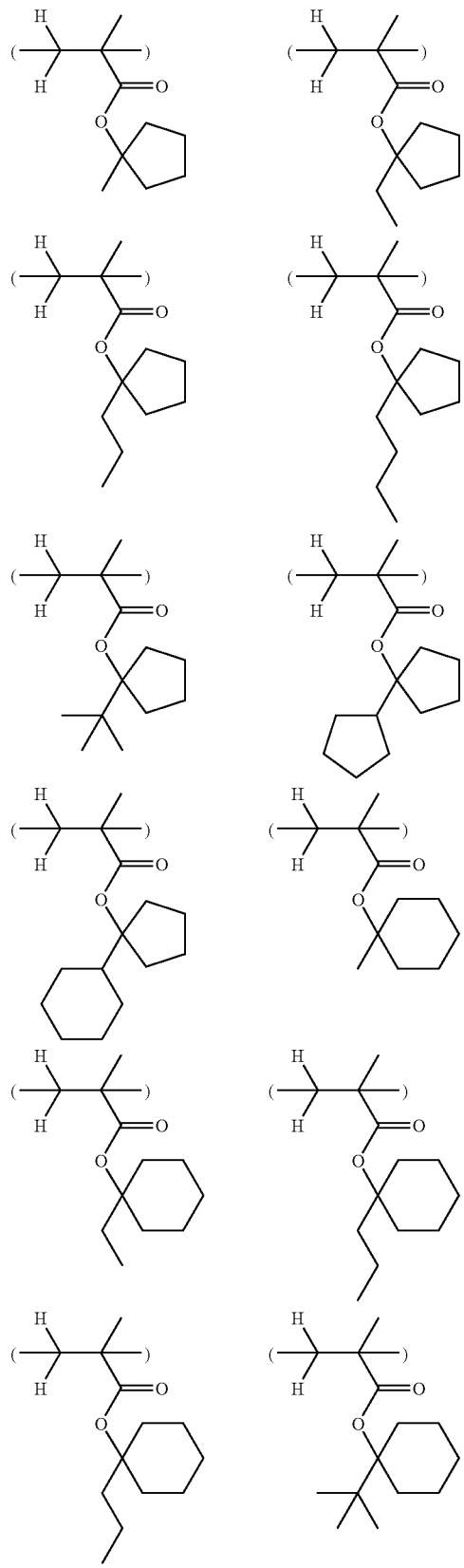

-continued
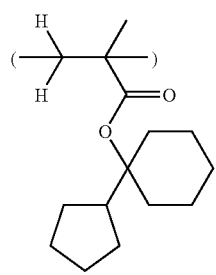 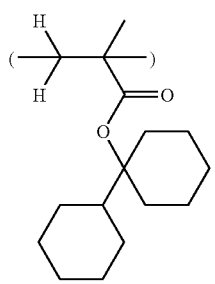
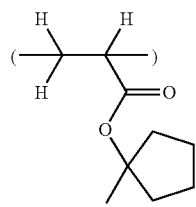 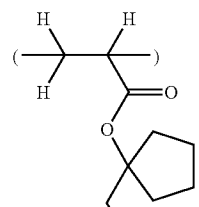
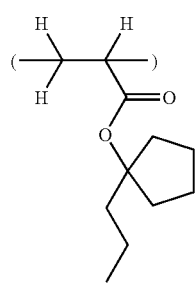 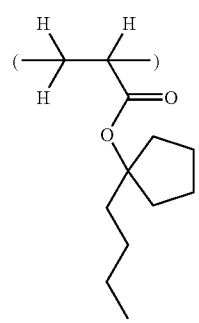
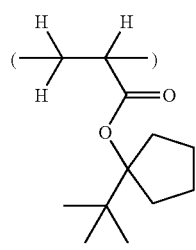 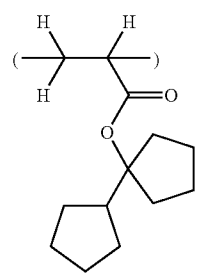
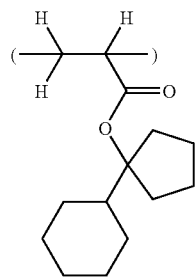 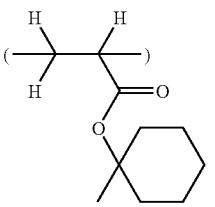
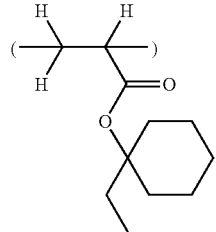 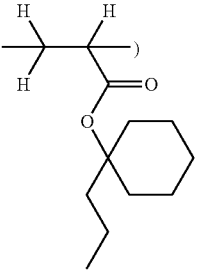
-continued
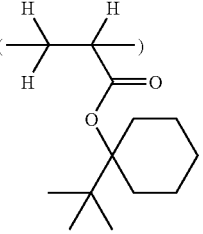
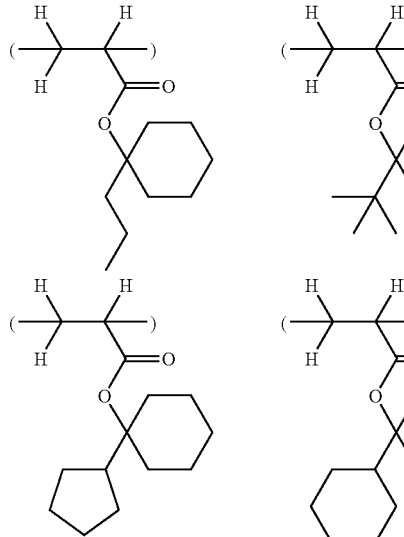 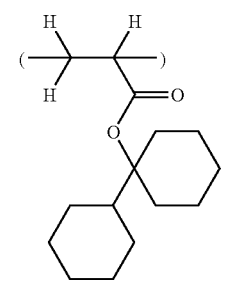
The specific examples of the repeating unit represented by formula (2) may include:
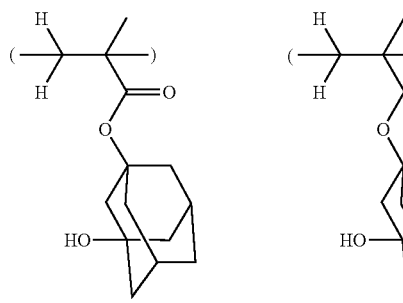
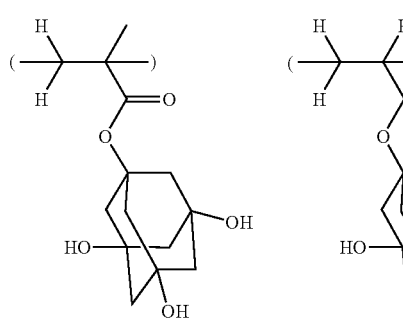
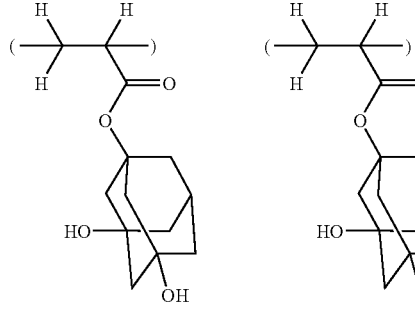
The repeating unit of formula (3) having a lactone structure may be preferably one or more selected from the repeating units represented by formulas (3-1) to (3-8):

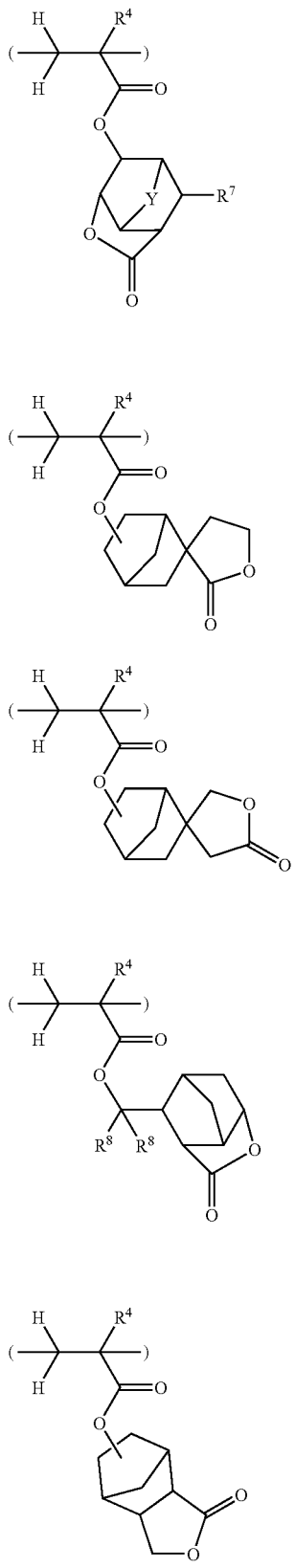

(3-1)

(3-2)

(3-3)

(3-4)

(3-5)

(3-6)

(3-7)

(3-8)

In formulas, $R^4$ represents a hydrogen atom or a methyl group.

$R^7$ represents a hydrogen atom or $CO_2R^9$ wherein $R^9$ represents a linear, branched or cyclic monovalent $C_{1-10}$ hydrocarbon group. $R^9$ may include methyl, ethyl, propyl, isopropyl, n-butyl, sec-butyl, tert-butyl, tert-amyl n-pentyl, n-hexyl, cyclopentyl, cyclohexyl, ethylcyclopentyl, butylcyclopentyl, ethylcyclohexyl and butylcyclohexyl groups.

$R^8$ represents a hydrogen atom or a linear, branched or cyclic monovalent $C_{1-10}$ hydrocarbon group. Alternatively, $R^8$s may be coupled to form a ring, together with the carbon atom to which $R^8$s are attached. $R^8$ may include methyl, ethyl, propyl, isopropyl, n-butyl, sec-butyl, tert-butyl, tert-amyl, n-pentyl, n-hexyl, cyclopentyl and cyclohexyl groups.

Y represents a methylene group or an oxygen atom.

Specific examples of the repeating unit represented by formula (3-1) may include, but not be limited to:

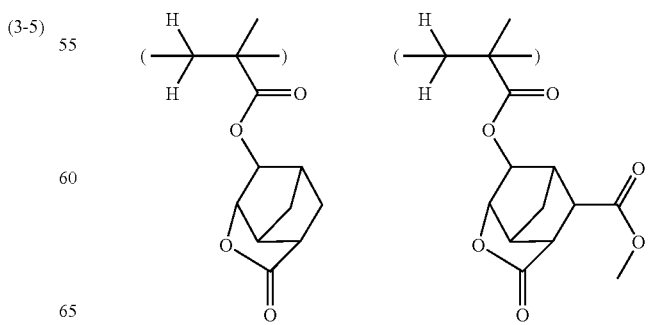

-continued
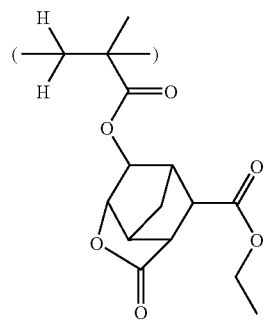
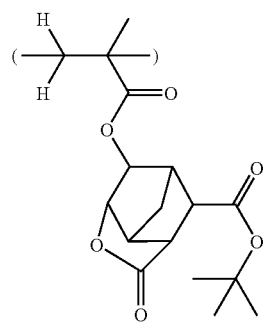
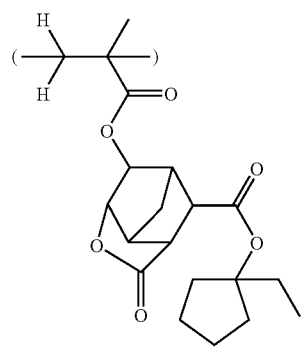
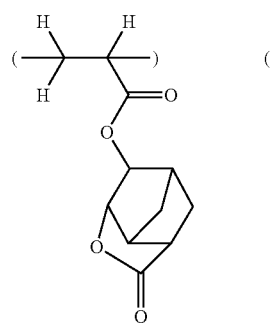
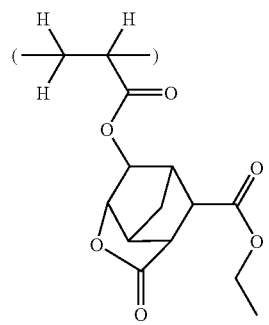
-continued
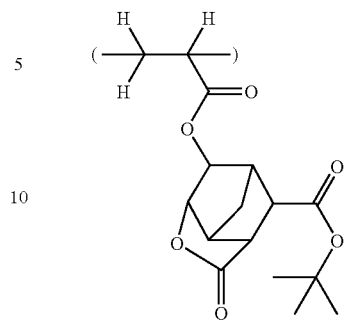
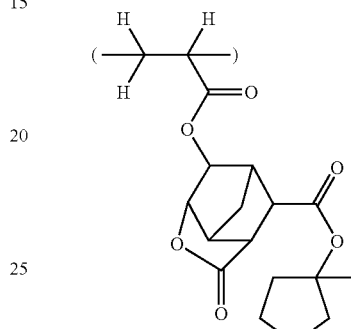
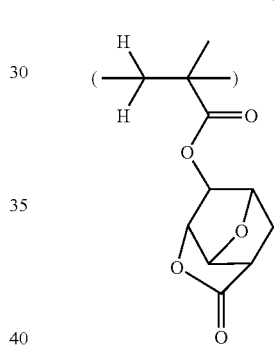
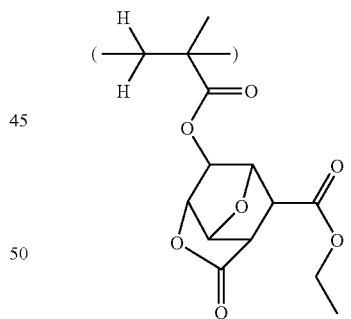
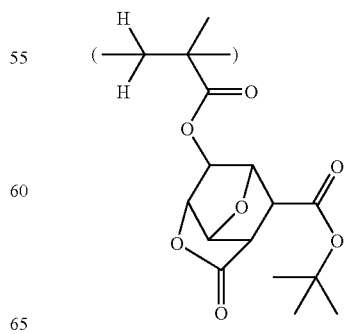

-continued
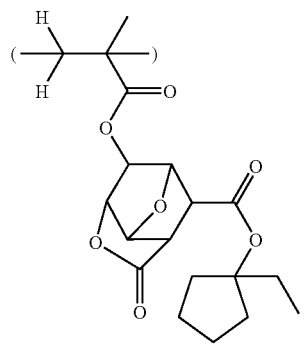
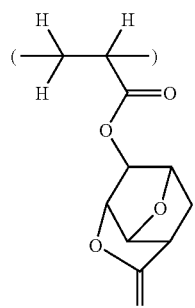 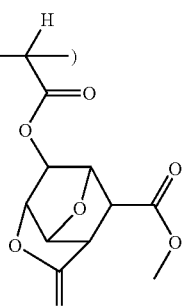
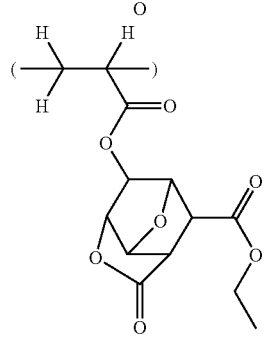
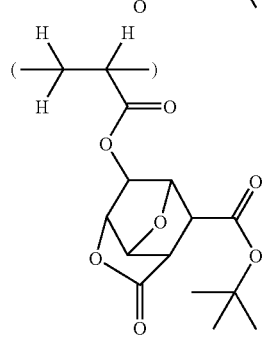
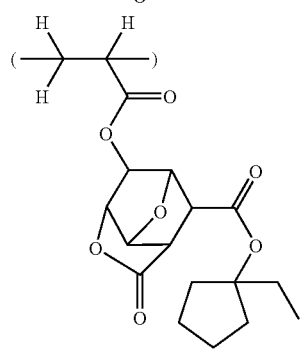
Specific examples of the repeating unit represented by formula (3-4) may include, but not be limited to:
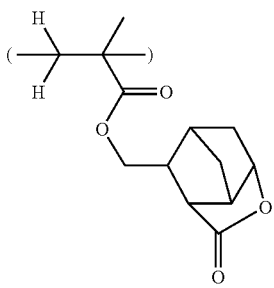
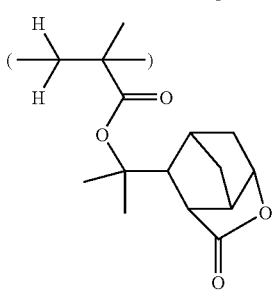
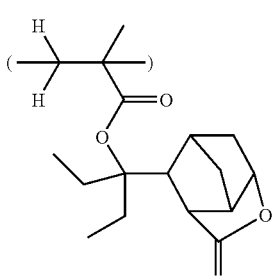
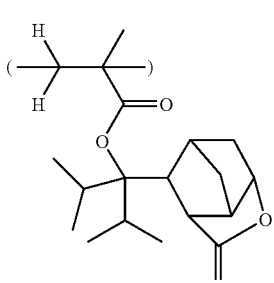
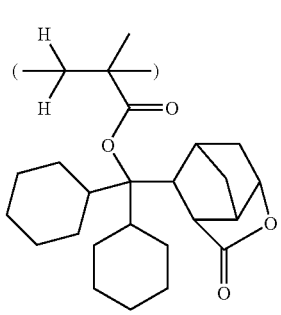

-continued

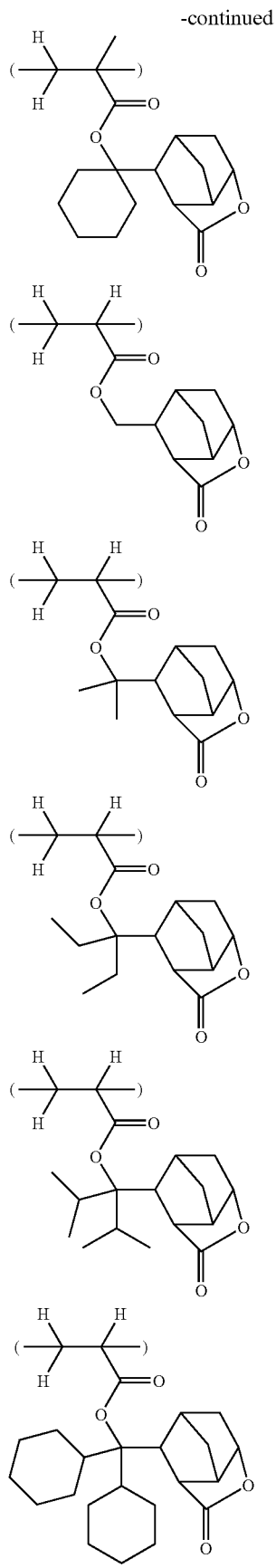

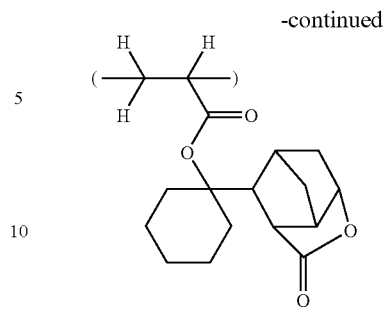

The polymer of the invention may further optionally comprise at least one selected from repeating units of the following formulas (Z-1) to (Z-3) having a carboxylic acid protected with an acid-decomposable protecting group containing an adamantane structure or tetracyclo [4.4.0.1$^{2.5}$.1$^{7.10}$]dodecane structure.

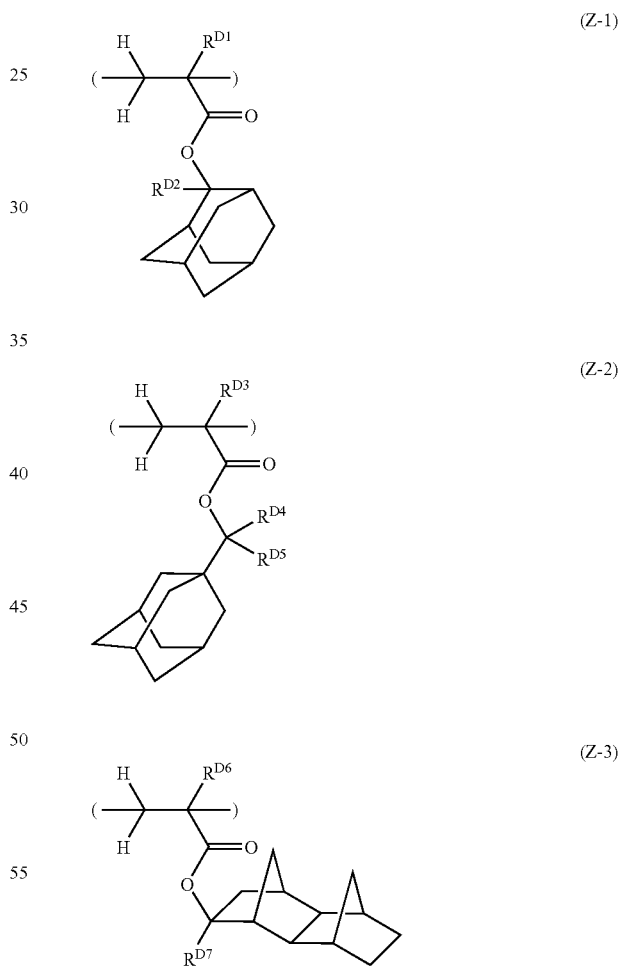

Herein, $R^{D1}$, $R^{D3}$ and $R^{D6}$ each represents a hydrogen atom or a methyl group. $R^{D2}$, $R^{D4}$, $R^{D6}$ and $R^{D7}$ each represents a linear, branched or cyclic $C_{1-12}$ alkyl group and may include same examples as those of $R^2$.

Formula (Z-3) is at least one selected from the units represented by formulas (Z-3-1) to (Z-3-4). Formula. (Z-3) also includes enantiomers and mixtures thereof.

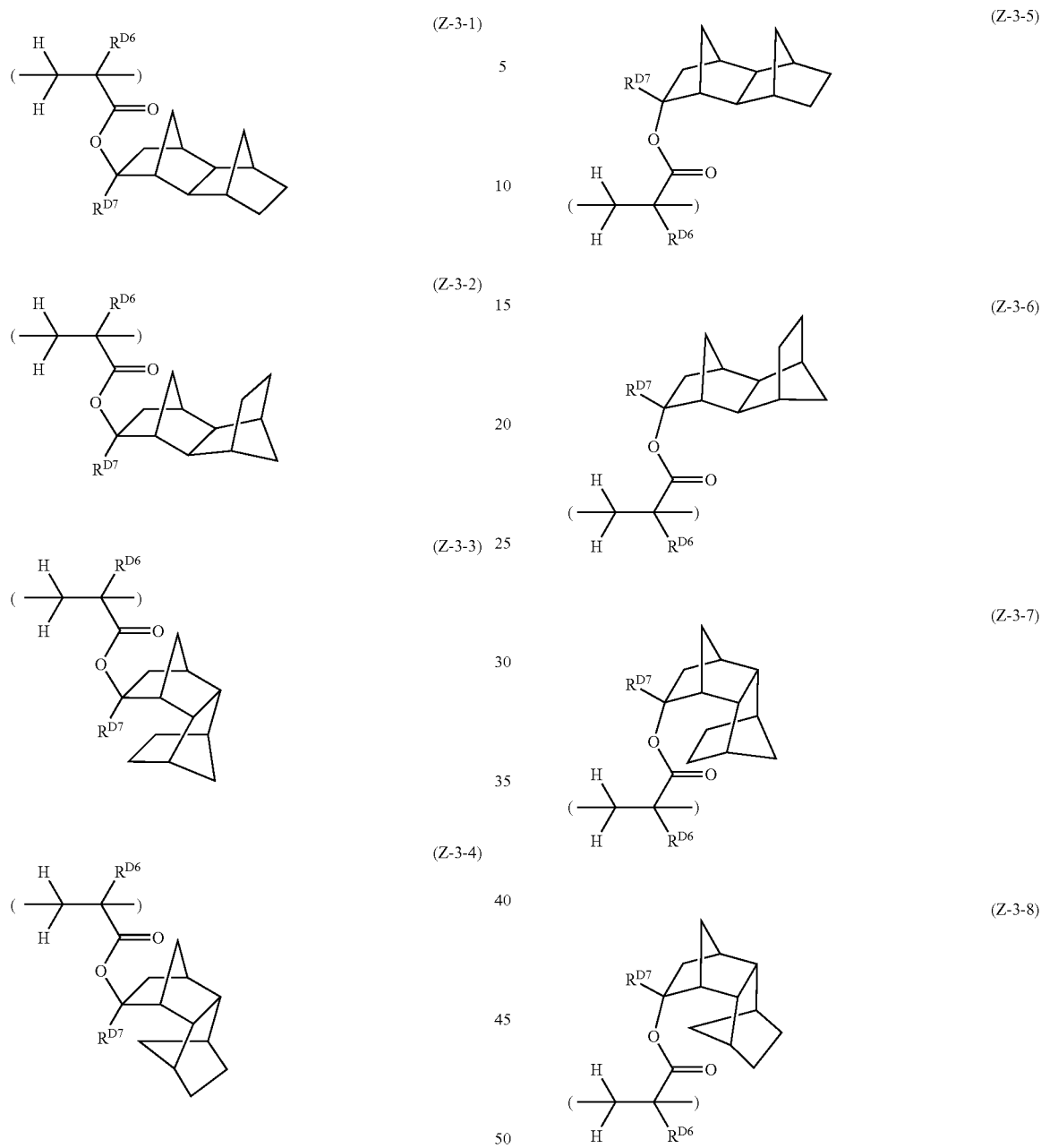

In formulas (Z-3), and (Z-3-1) to (Z-3-4), $R^{D7}$ exists on the endo side relative to the tetracyclo[4.4.0.1$^{2.5}$.1$^{7.10}$]dodecane ring. This steric structure permits a sensitive acid decomposition reactivity, reasons of which have already been described in Japanese Patent Application Unexamined Publication No. 2000-336121.

The polymer of the invention may sometimes comprise any one of structures represented by the following formulas (Z-3-5) to (Z-3-8) in which $R^{D7}$ exists on the exo side owing to the method for preparing a monomer. In order to ensure good acid decomposition reactivity, endo-$R^{D7}$ may preferably amount to 50% or greater, more preferably 80% or greater.

Specific examples of the repeating units represented by formula (Z-1) may include, but not be limited to:

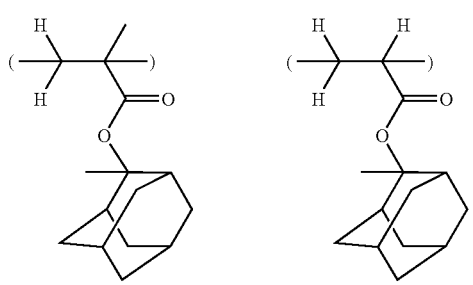

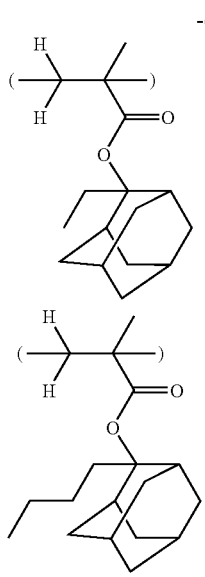
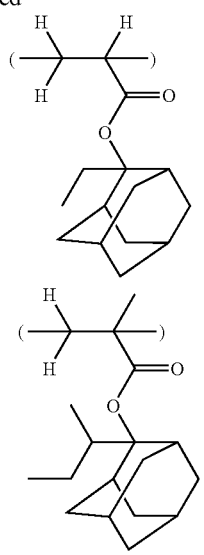
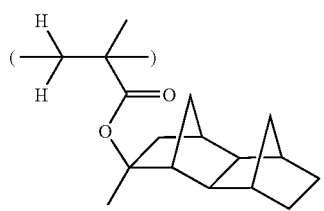

Specific examples of the repeating units represented by formula (Z-2) may include, but not be limited to:

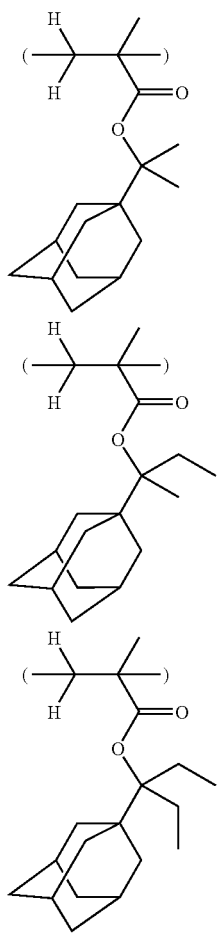
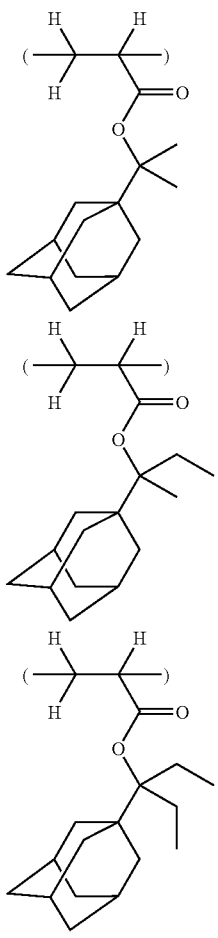
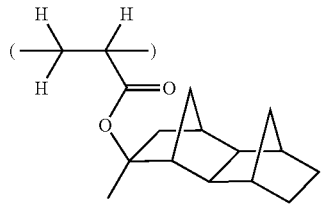
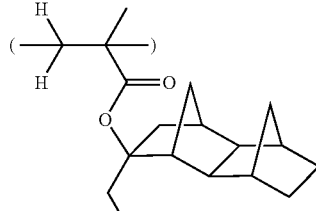
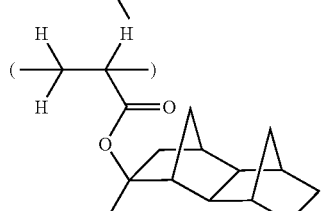
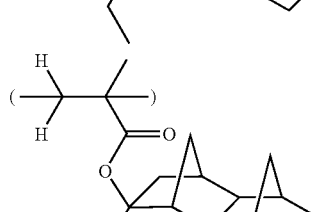
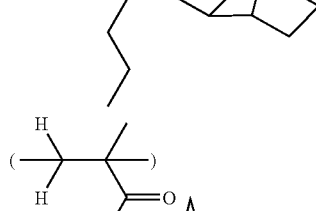
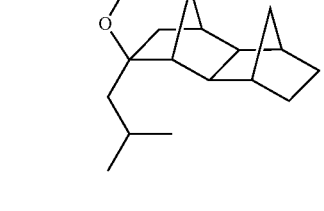

Specific examples of the repeating units represented by formula (Z-3) may include, but not be limited to:

The repeating units represented by formulas (Z-1) to (Z-3) may serve to impart or control the various properties of the resulting resist material such as resolution and etching resistance. The proper control on the content of these repeating units can finely adjust the performance of the resist material.

The polymer of the invention may further optionally comprise at least one selected from the repeating units represented by formulas (M1) to (M9):

(M1) 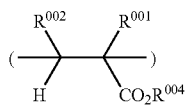

(M2) 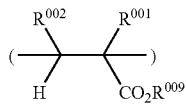

(M3) 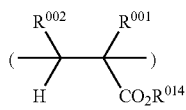

(M4) 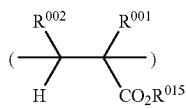

(M5) 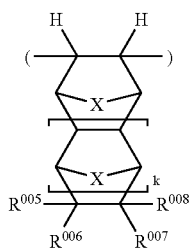

(M6) 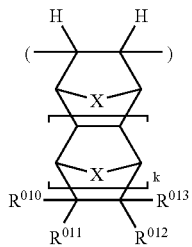

(M7) 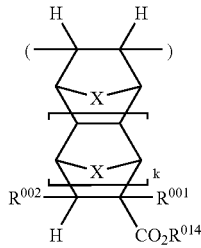

(M8) 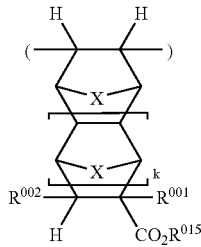

(M9) 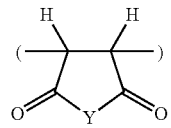

Herein, $R^{001}$ represents a hydrogen atom, a methyl group or $CH_2CO_2R^{003}$.

$R^{002}$ represents a hydrogen atom, a methyl group or $CO_2R^{003}$.

$R^{003}$ represents a linear, branched or cyclic $C_{1-15}$ alkyl group and may include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl and butyladamantyl groups.

$R^{004}$ represents a hydrogen atom or a monovalent $C_{1-15}$ hydrocarbon group having a carboxyl or hydroxyl group and may include a hydrogen atom, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl and hydroxyadamantyl groups.

At least one of $R^{005}$ to $R^{008}$ represents a monovalent $C_{1-15}$ hydrocarbon group having a carboxyl or hydroxyl group while the remaining one or ones each independently represents a hydrogen atom or a linear, branched or cyclic $C_{1-15}$ alkyl group. Specific examples of the monovalent carboxyl- or hydroxyl-containing $C_{1-5}$ hydrocarbon group may include carboxyl, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl and hydroxyadamantyloxycarbonyl.

Specific examples of the linear, branched or cyclic $C_{1-15}$ alkyl group are similar to those exemplified as $R^{003}$.

$R^{005}$ to $R^{008}$ may be coupled to form a ring, wherein at least one of $R^{005}$ to $R^{008}$ represents a divalent $C_{1-15}$ hydrocarbon group having a carboxyl or hydroxyl group, while the remaining one or ones each independently represents a single bond or a linear, branched or cyclic $C_{1-15}$ alkylene group. Examples of the divalent carboxyl- or hydroxyl-containing $C_{1-15}$ hydrocarbon group may include groups obtained by eliminating one hydrogen atom from the above-exemplified monovalent carboxyl- or hydroxyl-containing hydrocarbon group. Examples of the linear, branched or cyclic $C_{1-15}$ alkylene groups may include groups obtained by eliminating one hydrogen atom from the groups exemplified as $R^{003}$.

$R^{009}$ represents a monovalent $C_{3-15}$ hydrocarbon group containing a —$CO_2$— structure. Specific examples may include 2-oxooxolan-3-yl, 4,4-dimethyl-2-oxooxolan-3-yl, 4-methyl-2-oxooxan-4-yl, 2-oxo-1,3-dioxolan-4-ylmethyl and 5-methyl-2-oxooxolan-5-yl.

At least one of $R_{010}$ to $R^{013}$ represents a monovalent $C_{2-15}$ hydrocarbon group containing a —$CO_2$— structure and the remaining one or ones each independently represents a hydrogen atom or a linear, branched or cyclic $C_{1-15}$ alkyl group. Specific examples of the monovalent $C_{2-15}$ hydrocarbon group containing a —$CO_2$— structure may include 2-oxooxolan-3-yloxycarbonyl, 4,4-dimethyl-2-oxooxolan-3-yloxycarbonyl, 4-methyl-2-oxooxan-4-yloxyarbonyl, 2-oxo-1,3-dioxolan-4-ylmethyloxycarbonyl and 5-methyl-2-oxooxolan-5-yloxycarbonyl. Examples of the linear, branched or cyclic $C_{1-15}$ alkyl groups may include the same as those exemplified as $R^{O03}$.

$R^{O10}$ to $R^{O13}$ may be coupled to form a ring, wherein at least one of $R^{O10}$ to $R^{O13}$ represents a divalent $C_{1-15}$ hydrocarbon group containing a —$CO_2$— structure and the remaining one or ones each independently represents a single bond or a linear, branched or cyclic $C_{1-15}$ alkylene group. Examples of the divalent $C_{1-15}$ alkylene group having a —$CO_2$—partial structure may include 1-oxo-2-oxapropane-1,3-diyl, 1,3-dioxo-2-oxapropane-1,3-diyl, 1-oxo-2-oxabutane-1,4-diyl and 1,3-dioxo-2-oxabutane-1,4-diyl and in addition, groups obtained by eliminating one hydrogen atom from those exemplified above as the monovalent hydrocarbon group containing a —$CO_2$— structure. Examples of the linear, branched or cyclic $C_{1-15}$ alkylene group may include groups obtained by eliminating one hydrogen atom from those exemplified as $R^{O03}$.

$R^{O14}$ represents a $C_{7-15}$ polycyclic hydrocarbon group or an alkyl group-containing a polycyclic hydrocarbon group. Specific examples may include norbornyl, bicyclo[3.3.1]nonyl, tricyclo[5.2.1.0$^{2,6}$]decyl, adamantyl, ethyladamantyl, butyladamantyl, norbornylmethyl and adamantylmethyl groups.

$R^{O15}$ represents an acid-labile group and specific examples thereof which will be described later.

X represents $CH_2$ or an oxygen atom.

Y represents —O— or —(NR$^{116}$)—. R$^{116}$ represents a hydrogen atom or a linear, branched or cyclic $C_{1-15}$ alkyl group and may include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl and butyladamantyl groups.

The letter k stands for 0 or 1.

Various acid-labile groups can be used as the acid-labile group of $R^{O15}$. Examples may include groups represented by the following formulas (L1) to (L4), tertiary alkyl groups having 4 to 20, preferably 4 to 15 carbon atoms, trialkylsilyl groups with each alkyl being a $C_{1-6}$ alkyl group and $C_{4-20}$ oxoalkyl groups.

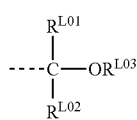  (L1)

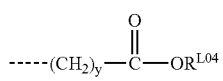  (L2)

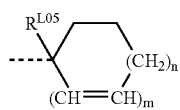  (L3)

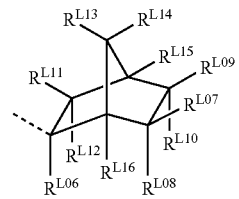  (L4)

In the above formulas, a broken line indicates a bonding site and bonding direction.

In these formulas, y stands for an integer of from 0 to 6, and m stands for 0 or 1 and n stands for any one of 0, 1, 2 and 3, satisfying 2 m+n=2 or 3.

$R^{L01}$ and $R^{L02}$ each represents a hydrogen atom or a linear, branched or cyclic $C_{1-18}$, preferably $C_{1-10}$ alkyl group. Specific examples may include methyl, ethyl, propyl, isopropyl, n-butyl, sec-butyl, tert-butyl, cyclopentyl, cyclohexyl, 2-ethylhexyl and n-octyl.

$R^{L03}$ represents a monovalent $C_{1-18}$, preferably $C_{1-10}$ hydrocarbon group which may comprise a hetero atom such as oxygen atom. Examples may include linear, branched or cyclic alkyl groups, and such alkyl groups having part of the hydrogen atoms substituted by hydroxyl, alkoxy, oxo, amino, alkylamino or the like. Specific examples may include the following substituted alkyl groups, wherein a broken line indicates a bonding site.

A pair of $R^{L01}$ and $R^{L02}$, $R^{L01}$ and $R^{L03}$, or $R^{L02}$ and $R^{L03}$ may be coupled to form a ring. If a ring is formed, each of $R^{L01}$, $R^{L02}$ and $R^{L03}$ represents a linear or branched $C_{1-18}$, preferably $C_{1-10}$ alkylene group.

$R^{L04}$ represents a $C_{4-20}$, preferably $C_{4-15}$ tertiary alkyl group, a trialkylsilyl group having each alkyl being a $C_{1-6}$ alkyl group, a $C_{4-20}$ oxoalkyl group, or a group represented by formula (L1). Examples of the tertiary alkyl group may include tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl and 2-ethyl-2-adamantyl. Examples of the trialkylsilyl group may include trimethylsilyl, triethylsilyl and dimethyl-tert-butylsilyl. Examples of the oxoalkyl group may include 3-oxocyclohexyl, 4-methyl-2-oxooxan-4-yl and 5-methyl-2-oxooxolan-5-yl.

$R^{L05}$ represents a monovalent $C_{1-8}$ hydrocarbon group which may contain a hetero atom or a substituted or unsubstituted $C_{6-20}$ aryl group. Examples of the monovalent hydrocarbon group which may contain a hetero atom may include linear, branched or cyclic alkyl groups such as methyl, ethyl, propyl, isopropyl, n-butyl, sec-butyl, tert-butyl, tert-amyl, n-pentyl, n-hexyl, cyclopentyl and cyclohexyl, and groups obtained by substituting part of the hydrogen atoms of these groups by a hydroxyl, alkoxy, carboxyl, alkoxycarbonyl, oxo, amino, alkylamino, cyano, mercapto, alkylthio or sulfo group. Examples of the substituted or unsubstituted aryl group may include phenyl, methylphenyl, naphthyl, anthryl, phenanthryl and pyrenyl.

$R^{L06}$ represents a monovalent $C_{1-8}$ hydrocarbon group which may contain a hetero atom, or a substituted or unsubstituted $C_{6-20}$ aryl group. Examples of these groups are same as those exemplified as $R^{L05}$.

$R^{L07}$ to $R^{L16}$ each independently represents a hydrogen atom or a monovalent $C_{1-15}$ hydrocarbon group which may contain a hetero atom. Specific examples may include linear, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and such alkyl groups having part of the hydrogen atoms substituted by a hydroxyl, alkoxy, carboxy, alkoxycarbonyl, oxo, amino, alkylamino, cyano, mercapto, alkylthio or sulfo group.

Alternatively, $R^{L07}$ to $R^{L16}$ may be coupled to form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, or $R^{L13}$ and $R^{L14}$) When they form a ring, each represents a divalent $C_{1-15}$ hydrocarbon group which may contain a hetero atom and may include groups obtained by eliminating one hydrogen atom from the groups exemplified above as monovalent hydrocarbon group. Any two of $R^{L07}$ to $R^{L16}$ having adjacent carbon atoms may be coupled directly to form a double bond (for example, a pair of $R^{L07}$ and $R^{L09}$, $R^{L09}$ and $R^{L15}$ or $R^{L13}$ and $R^{L15}$).

Of the acid-labile groups represented by formula (L1), the linear or branched groups may include the following formulas wherein a broken line indicates a bonding site.

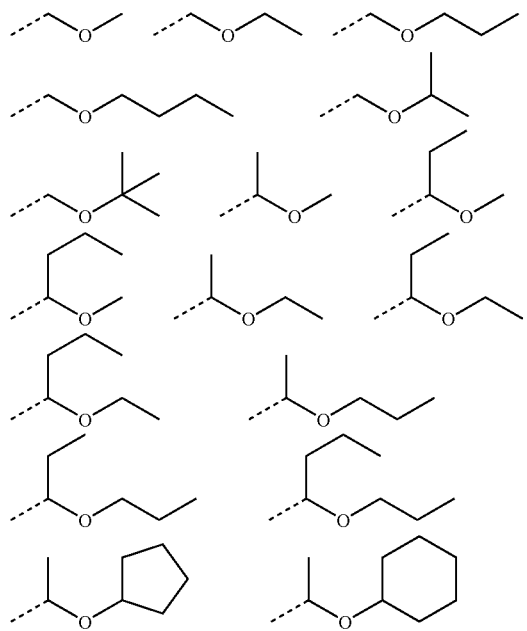

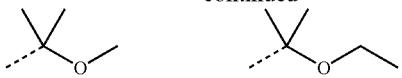

Of the acid-labile groups represented by formula (L1), examples of the cyclic ones include tetrahydrofuran-2-yl, 2-methyltetrahydrofuran-2-yl, tetrahydropyran-2-yl and 2-methyltetrahydropyran-2-yl.

Specific examples of the acid-labile groups represented by formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxy-carbonylmethyl, 2-tetrahydropyranyloxycarbonylmethyl and 2-tetrahydrofuranyloxycarbonylmethyl groups.

Examples of the acid-labile group represented by formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl and 3-ethyl-1-cyclohexen-3-yl groups.

Specific examples of the acid-labile group represented by formula (L4) may include the following formulas wherein a broken line means a bonding site and a bonding direction.

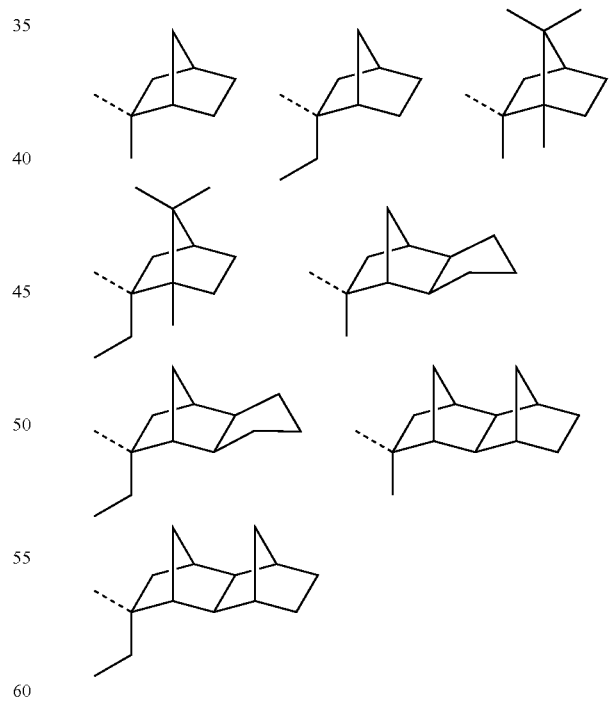

Examples of the $C_{4-20}$ tertiary alkyl groups, trialkylsilyl groups having each alkyl being a $C_{1-6}$ alkyl group and $C_{4-20}$ oxoalkyl groups may include same examples as those exemplified above as $R^{L04}$.

The repeating units of formulas (M1) to (M9) can serve to impart various properties such as affinity with developer, substrate adhesion and etching resistance to resist materials comprising the polymer of the invention. By properly controlling the content of these repeating units, the performance of the resist material can be finely adjusted.

The polymers of the invention have a weight-average molecular weight of from about 1,000 to 100,000, as measured by gel permeation chromatography (GPC) using polystyrene as a standard. Outside the above range, a drastic decrease in etching resistance may occur or resolution may lower because a substantial difference in the dissolution rate before and after exposure cannot be ensured.

The polymer of the invention can be prepared through copolymerization reaction using compounds of formulas (1a), (2a) and (3a) as first, second and third monomers, optionally at least one monomer selected from the compounds represented by formulas (Z-1a) to (Z-3a) as subsequent monomer(s), and optionally at least one monomer selected from the compounds represented by the below-described formulas (M1a) to (M9a) as further subsequent monomer(s).

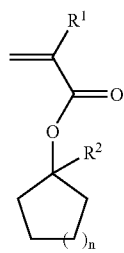

(1a)

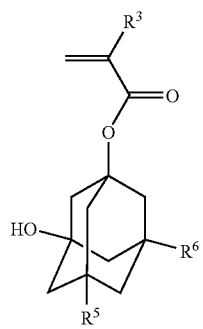

(2a)

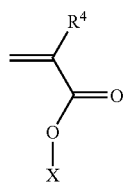

(3a)

wherein $R^1$ to $R^6$, X and n have the same meanings as described above.

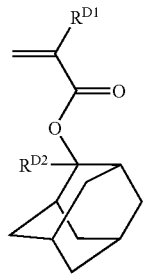

(Z-1a)

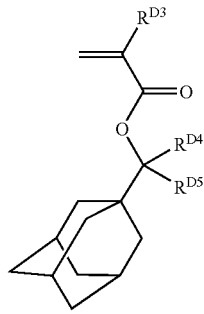

(Z-2a)

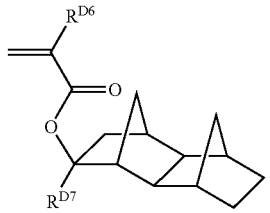

(Z-3a)

wherein $R^{D1}$ to $R^{D7}$ have the same meanings as described above.

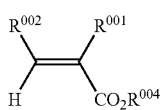

(M1a)

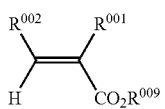

(M2a)

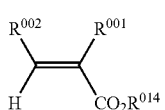

(M3a)

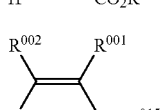

(M4a)

-continued (M5a)
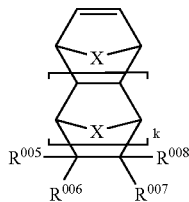

(M6a)
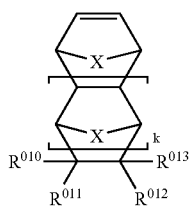

(M7a)
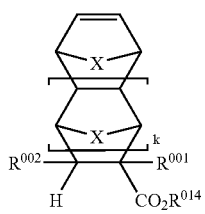

(M8a)
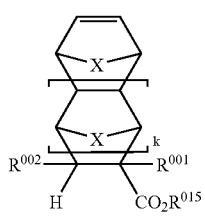

(M9a)
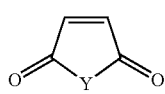

wherein k, $R^{001}$ to $R^{015}$, X and Y have the same meanings as described above.

By properly adjusting the proportion of the respective monomers used in the copolymerization reaction, the polymer capable of exerting a preferred performance when comprised in a resist material can be obtained.

In this case, the polymer of the invention may comprise:

(i) monomers of formulas (1a), (2a) and (3a), (ii) one or more monomers selected from monomers of formulas (Z1-a) to (Z3-a), and (iii) one or more monomers selected from monomers of formulas (M1a) to (M9a), (iv) one or more monomers other than the above monomers of (i) to (iii) and containing a carbon-carbon double bond, for example, including substituted acrylate ester such as methyl methacrylate, methyl crotonate, dimethyl maleate and dimethyl itaconate; unsaturated carboxylic acid such as maleic acid, fumaric acid and itaconic acid; substituted or unsubstituted norbornene such as norbornene or methyl norbornene-5-carboxylate; unsaturated acid anhydride such as itaconic anhydride; and others.

The polymers of the invention may comprise each repeating unit based on each monomer preferably in the following amount. For example, they comprise:

(i) from 2.5 to 95 mol %, preferably from 5 to 90 mol %, more preferably from 10 to 80 mol % of the repeating unit of formula (1) based on the monomer of formula (1a), (ii) from 2.5 to 95 mol %, preferably from 5 to 90 mol %, more preferably from 10 to 80 mol % of the repeating unit of formula (2) based on the monomer of formula (2a), (iii) from 2.5 to 95 mol %, preferably from 5 to 90 mol %, more preferably from 10 to 80 mol % of the repeating unit of formula (3) based on the monomer of formula (3a), (iv) from 0 to 90 mol %, preferably from 0 to 70 mol %, more preferably from 0 to 50 mol % of the repeating unit of formulas (Z-1) to (Z-3) based on the monomer of formulas (Z-1a) to (Z-3a), (v) from 0 to 60 mol %, preferably from 0 to 40 mol %, more preferably from 0 to 30 mol % of the repeating unit of formulas (M1) to (M9) based on the monomer of formulas (M1a) to (M9a), and (vi) from 0 to 60 mol %, preferably from 0 to 40 mol %, more preferably from 0 to 30 mol % of the other repeating unit based on the other monomer.

The proportion is, however, not limited to the above-descried range.

The monomer of formula (1a) on which the unit of formula (1) essential for the polymer of the invention is based can be commercially available, and may be used as is or may be prepared in a known process of organic chemistry by using cyclopentanone or cyclohexanone as a raw material.

The monomer of formula (2a) on which the unit of formula (2) is based can be commercially available, and may be used as is or may be prepared in a known process of organic chemistry by using a hydroxyadamantane as a raw material.

The monomer of formula (3a) on which the unit of formula (3) is based on can be commercially available. The monomer on which the unit of formula (3-1) is based can be prepared in a process as described in Japanese Patent Application Unexamined Publication No. 2000-159758. The monomer on which the unit of formula (3-2) or (3-3) is based can be prepared in a process as described in Japanese Patent Application Unexamined Publication No. 2002-37114. The monomer on which the unit of formula (3-4) is based and in which $R^8$ is a hydrogen atom can be prepared in a process as described in Japanese Patent Application Unexamined Publication No. 2003-2883. The monomer on which the unit of formula (3-4) is based and in which $R^8$ is an atom or group other than a hydrogen atom can be prepared in a process as described in Japanese Patent Application Unexamined Publication No. 2004-115486. Monomers on which the units of formulas (3-5) to (3-8) are based can be prepared in a known manner based on organic chemistry.

Various copolymerization reactions can be given as the examples of the preparation process of the polymer of the invention, but radical polymerization is preferred.

Radical polymerization is carried out preferably under the following conditions: (a) solvent: for example, hydrocarbon such as benzene, ether such as tetrahydrofuran or propylene glycol monomethyl ether acetal, alcohol such as ethanol, ketone such as methyl ethyl ketone or methyl isobutyl ketone, or ester such as ethyl acetate or γ-butylolactone, (b) a polymerization initiator: for example, an azo compound such as 2,2'-azobisisobutyronitrile, or peroxide such as benzoyl peroxide or lauroyl peroxide, (c) reaction temperature: for example, maintained at from about 0° C. to 100° C., and (d) reaction time: for example, from about 0.5 hour to 48 hours. The conditions outside the above range are also permissible.

The resist material of the invention may comprise a compound (which will hereinafter be called "photoacid generator") capable of generating an acid, responding to high energy radiation or electron beam, an organic solvent or the other optional component.

Any photoacid generator capable of generating an acid when exposed to high energy radiation can be used in the invention. Preferred examples of the photoacid generator include sulfonium salts, iodonium salts, sulfonyldiazomethane and N-sulfonyloxyimide acid generators. Specific examples of the photoacid generator will next be described. They can be used either singly or in combination of two or more thereof.

The sulfonium salt is a salt of sulfonium cation and sulfonate.

Examples of the sulfonium cation include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxy-phenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexyl-methylsulfonium, trinaphthylsulfonium, tribenzylsulfonium, diphenylmethylsulfonium, dimethylphenylsulfonium, and 2-oxo-2-phenylethylthiacyclopentanium.

Examples of the sulfonate include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate and methanesulfonate. The sulfonium salt of the combination can be used.

The iodonium salt is a salt of an iodonium cation with sulfonate. Examples of the iodonium cation include aryliodonium cations such as diphenyliodonium, bis(4-tert-butylphenyl)-iodonium, 4-tert-butoxyphenylphenyliodonium, and 4-methoxyphenylphenyliodonium. Examples of the sulfonate include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate and methanesulfonate. The iodonium salt of the combination can be used.

Examples of the sulfonyldiazomethane include bissulfonyldiazomethanes and sulfonyl-carbonyldiazomethanes such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsuflonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

The N-sulfonyloxyimide photoacid generator includes combination of an imide skeleton such as succinimide, naphthalene dicarboxyimide, phthalimide, cyclohexyldicarboxyimide, 5-norbornene-2,3-dicarboxyimide, or 7-oxabicyclo[2.2.1]-5-heptene-2,3-dicarboxyimide with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, or methanesulfonate.

The benzoinsulfonate photoacid generator includes benzoin tosylate, benzoin mesylate and benzoin butanesulfonate.

The pyrogallol trisulfonate photoacid generator includes compounds obtained by substituting all the hydroxyl groups of pyrogallol, fluoroglycine, catechol, resorcinol or hydroquinone with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate or methanesulfonate.

The nitrobenzyl sulfonate photoacid generator includes 2,4-dinitrobenzyl sulfonate, 2-nitrobenzyl sulfonate, and 2,6-dinitrobenzyl sulfonate. The sulfonate may include more specifically trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate and methanesulfonate. A compound obtained by substituting the nitro group on the benzyl side with a trifluoromethyl group can also be used.

The sulfone photoacid generator includes bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

The photoacid generator in the form of a glyoxime derivative includes compounds as described in Japanese Patent No. 2,906,999 and Japanese Patent Application Unexamined Publication No. 9-301948/1997. Specific examples include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Additional examples include oxime sulfonates as described in U.S. Pat. No. 6,004,724, especially, (5-(4-toluenesulfonyl)oxyimino-5H-thiophen-2-ylidene)phenylacetonitrile, (5-(10-camphorsulfonyl)oxyimino-5H-thiophen-2-ylidene)phenyl-acetonitrile, (5-(n-octanesulfonyloxyimino-5H-thiophen-2-ylidene)phenylacetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile and (5-(n-octanesulfonyl)oxyimino-5H-thiophen-2-ylidene)(2-methylphenyl)acetonitrile.

Further additional examples include the oxime sulfonates as described in U.S. Pat. No. 6,261,738 and Japanese Patent Application Unexamined Publication No. 2000-314956, especially, 2,2,2-trifluoro-1-phenyl-ethanone oxime-O-methylsulfonate, 2,2,2-trifluoro-1-phenyl-ethanone oxime-O-(10-camphorylsulfonate), 2,2,2-trifluoro-1-phenyl-ethanone oxime-O-(4-methoxyphenylsulfonate), 2,2,2-trifluoro-1-phenyl-ethanone oxime-O-(1-naphthylsulfonate), 2,2,2-trifluoro-1-phenyl-ethanone oxime-O-(2-naphthylsulfonate), 2,2,2-trifluoro-1-phenyl-ethanone oxime-O-(2,4,6-trimethylphenylsulfonate), 2,2,2-trifluoro-1-(4-methylphenyl)-ethanone oxime-O-(10-camphorylsulfonate), 2,2,2-trifluoro-1-(4-methylphenyl)-ethanone oxime-O-(methylsulfonate), 2,2,2-trifluoro-1-(2-methylphenyl)-ethanone oxime-O-(10-camphorylsulfonate), 2,2,2-trifluoro-1-(2,4-dimethylphenyl)-ethanone oxime-O-(10-camphorylsulfonate), 2,2,2-trifluoro-1-(2,4-dimethylphenyl)-ethanone oxime-O-(1-naphthylsulfonate), 2,2,2-trifluoro-1-(2,4-dimethylphenyl)-ethanone oxime-O-(2-naphthylsulfonate), 2,2,2-trifluoro-1-(2,4,6-trimethylphenyl)-ethanone oxime-O-(10-camphorylsulfonate), 2,2,2-trifluoro-1-(2,4,6-trimethylphenyl)-ethanone oxime-O-(1-naphthylsulfonate), 2,2,2-trifluoro-1-(2,4,6-trimethylphenyl)-ethanone oxime-O-(2-naphthylsulfonate), 2,2,2-trifluoro-1-(4-methoxyphenyl)-ethanone oxime-O-methylsulfonate, 2,2,2-trifluoro-1-(4-methylthiophenyl)-ethanone oxime-O-methylsulfonate, 2,2,2-trifluoro-1-(3,4-dimethoxyphenyl)-ethanone oxime-O-methylsulfonate, 2,2,3,3,4,4,4-heptafluoro-1-phenyl-butanone oxime-O-(10-camphorylsulfonate), 2,2,2-trifluoro-1-(phenyl)-ethanone oxime-O-methylsulfonate, 2,2,2-trifluoro-1-(phenyl)-ethanone oxime-O-10-camphorylsulfonate, 2,2,2-trifluoro-1-(phenyl)-ethanone oxime-O-(4-methoxyphenyl)sulfonate, 2,2,2-trifluoro-1-(phenyl)-ethanone oxime-O-(1-naphthyl)sulfonate, 2,2,2-trifluoro-1-(phenyl)-ethanone oxime-O-(2-naphthyl)sulfonate, 2,2,2-trifluoro-1-(phenyl)-ethanone oxime-O-(2,4,6-trimethylphenyl)sulfonate, 2,2,2-trifluoro-1-(4-methylphenyl)-ethanone oxime-O-(10-camphoryl)sulfonate, 2,2,2-trifluoro-1-(4-methylphenyl)-ethanone oxime-O-methylsulfonate, 2,2,2-trifluoro-1-(2-methylphenyl)-ethanone oxime-O-(10-camphoryl)sulfonate, 2,2,2-trifluoro-1-(2,4-dimethylphenyl)-ethanone oxime-O-(1-naphthyl)sulfonate, 2,2,2-trifluoro-1-(2,4-dimethylphenyl)-ethanone oxime-O-(2-naphthyl)sulfonate, 2,2,2-trifluoro-1-(2,4,6-trimethylphenyl)-ethanone oxime-O-(10-camphoryl)sulfonate, 2,2,2-trifluoro-1-(2,4,6-trimethylphenyl)-ethanone oxime-O-(1-naphthyl)sulfonate, 2,2,2-trifluoro-1-(2,4,6-trimethylphenyl)-ethanone oxime-O-(2-naphthyl)sulfonate, 2,2,2-trifluoro-1-(4-methoxyphenyl)-ethanone oxime-O-methylsulfonate, 2,2,2-trifluoro-1-(4-thiomethylphenyl)-ethanone oxime-O-methylsulfonate, 2,2,2-trifluoro-1-(3,4-dimethoxyphenyl)-ethanone oxime-O-methylsulfonate, 2,2,2-trifluoro-1-(4-methoxyphenyl)-ethanone oxime-O-(4-methylphenyl)sulfonate, 2,2,2-trifluoro-1-(4-methoxyphenyl)-ethanone oxime-O-(4-methoxyphenyl)sulfonate, 2,2,2-trifluoro-1-(4-methoxyphenyl)-ethanone oxime-O-(4-dodecylphenyl)-sulfonate, 2,2,2-trifluoro-1-(4-methoxyphenyl)-ethanone oxime-O-octylsulfonate, 2,2,2-trifluoro-1-(4-thiomethylphenyl)-ethanone oxime-O-(4-methoxyphenyl)sulfonate, 2,2,2-trifluoro-1-(4-thiomethylphenyl)-ethanone oxime-O-(4-dodecylphenyl)sulfonate, 2,2,2-trifluoro-1-(4-thiomethylphenyl)-ethanone oxime-O-octylsulfonate, 2,2,2-trifluoro-1-(4-thiomethylphenyl)-ethanone oxime-O-(2-naphthyl)sulfonate, 2,2,2-trifluoro-1-(2-methylphenyl)-ethanone oxime-O-methylsulfonate, 2,2,2-trifluoro-1-(4-methylphenyl)ethanone oxime-O-phenylsulfonate, 2,2,2-trifluoro-1-(4-chlorophenyl)-ethanone oxime-O-phenylsulfonate, 2,2,3,3,4,4,4-heptafluoro-1-(phenyl)-butanone oxime-O-(10-camphoryl)sulfonate, 2,2,2-trifluoro-1-naphthyl-ethanone oxime-O-methylsulfonate, 2,2,2-trifluoro-2-naphthyl-ethanone oxime-O-methylsulfonate, 2,2,2-trifluoro-1-[4-benzylphenyl]-ethanone oxime-O-methylsulfonate, 2,2,2-trifluoro-1-[4-(phenyl-1,4-dioxa-but-1-yl)phenyl]-ethanone oxime-O-methylsulfonate, 2,2,2-trifluoro-1-naphthyl-ethanone oxime-O-propylsulfonate, 2,2,2-trifluoro-2-naphthyl-ethanone oxime-O-propylsulfonate, 2,2,2-trifluoro-1-[4-benzylphenyl]-ethanone oxime-O-propyl-sulfonate, 2,2,2-trifluoro-1-[4-methylsulfonylphenyl]-ethanone oxime-O-propylsulfonate, 1,3-bis[1-(4-phenoxyphenyl)-2,2,2-trifluoroethanone oxime-O-sulfonyl]phenyl, 2,2,2-trifouoro-1-[4-methylsulfonyloxyphenyl]-ethanone oxime-O-propylsulfonate, 2,2,2-trifluoro-1-[4-methylcarbonyloxyphenyl]-ethanone oxime-O-propylsulfonate, 2,2,2-trifluoro-1-[6H,7H-5,8-dioxonaphth-2-yl)-ethanone oxime-O-propylsulfonate, 2,2,2-trifluoro-1-[4-methoxycarbonylmethoxyphenyl]-ethanone oxime-O-propylsulfonate, 2,2,2-trifluoro-1-[4-(methoxycarbonyl)-(4-amino-1-oxa-pent-1-yl)-phenyl]-ethanone oxime-O-propylsulfonate, 2,2,2-trifluoro-1-[3,5-dimethyl-4-ethoxyphenyl]-ethanone oxime-O-propylsulfonate, 2,2,2-trifluoro-1-[4-benzyloxyphenyl]-ethanone oxime-O-propylsulfonate, 2,2,2-trifluoro-1-[2-thiophenyl]-ethanone oxime-O-propylsulfonate and 2,2,2-trifluoro-1-[1-dioxathiophen-2-yl]-ethanone oxime-O-propylsulfonate.

Still further additional examples include oxime sulfonates described in Japanese Patent Application Unexamined Publication Nos. 9-95479/1997, 9-230588/1997 and described as the prior art in the specification, especially α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile and α-(n-butylsulfonyloxyimino)-1-cyclohexenylacetonitrile.

Examples of the bisoxime sulfonate include those described in Japanese Patent Application Unexamined Publication No. 9-208554/1997, especially bis(α-(4-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(4-toluenesulfonyloxy)imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(4-toluenesulfonyloxy)imino)-m-phenylenediacetonitrile, bis(α-(benzenesulfonyloxy)imino)-m-phenylenediacetonitrile, bis(α-(methanesulfonyloxy)imino]-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(4-toluenesulfonyloxy)imino)-m-phenylenediacetonitrile, bis(α-(trifluoromethanesulfonyloxy)imino)-m-phenylenediacetonitrile, and bis(α-(4-methoxybenzenesulfonyloxy)imino)-m-phenylenediacetonitrile.

Of these, the preferred photoacid generator includes sulfonium salts, bissulfonyldiazomethanes, N-sulfonyloxydicarboxyimides and glyoxime derivatives. More preferred examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyloxy) benzenesulfonate, tris(4-methylphenyl)sulfonium camphorsulfonate, tris(4-tert-butylphenyl)sulfonium camphorsulfonate, bis(tert-butylsulfonyl)diazomethane, bis(cyclohexylsulfonyl)diazomethane, bis(2,4-dimethylphenylsulfonyl)diazomethane, bis(4-n-hexyloxy)phenylsulfonyl) diazomethane, bis(2-methyl-4-(n-hexyloxy)phenylsulfonyl) diazomethane, bis(2,5-dimethyl-4-(n-hexyloxy) phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, bis (4-tert-butylphenylsulfonyl)diazomethane, N-camphorsulfonyloxy-5-norbornene-2,3-carboxyimide, and N-p-toluenesulfonyloxy-5-norbornene-2,3-carboxyimide.

Although the photoacid generator may be added in any amount to the chemical amplified resist material of the invention, it is preferably from 0 to 10 parts by weight, more preferably from 0 to 5 parts by weight based on 100 parts by weight of the solid content in the resist material. Too high a proportion of the photoacid generator may give rise to problems of degraded resolution and contamination upon development and resist film peeling. The photoacid generator may be used either singly or in combination of two or more. The transmittance in the resist film can be controlled by using a photoacid generator having a low transmittance at the exposure wavelength and adjusting its amount.

The resist material of the invention may comprise a compound decomposed with an acid to generate an acid (acid-propagating compound). For this compound, reference should be made to J. Photopolym. Sci. and Tech., 8, 43–44, 45–46 (1995), and ibid., 9, 29–30 (1996).

Examples of the acid-propagating compound include, but not limited to, tert-butyl-2-methyl-2-tosyloxymethyl acetoacetate and 2-phenyl-2-(2-tosyloxyethyl)-1,3-dioxolane. Of the known photoacid generators, compounds having poor stability, especially poor thermal stability tend to exhibit an acid-propagating compound-like behavior.

The resist material of the invention may comprise the acid-propagating compound in an amount of 2 parts by weight or less, preferably 1 part by weight or less based on 100 parts by weight of the solid content in the resist material. Addition of an excessive amount of it may make diffusion control difficult, leading to degradation of resolution and pattern configuration.

The organic solvent to be used in the invention may be any organic solvent capable of dissolving therein the solid content, photoacid generator and additives in the resist material.

Examples of such organic solvent include, but not limited to, ketones such as cyclohexanone and methyl-2-n-amylketone; alcohols such as 3-methoxybutanol, 3-methyl-3-methoxybutanol, 1-methoxy-2-propanol and 1-ethoxy-2-propanol, ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and lactones such as γ-butyrolactone. These solvents may be used singly or in combination of two or more thereof. Of the above-described organic solvents, diethylene glycol dimethyl ether, 1-ethoxy-2-propanol, propylene glycol monomethyl ether acetate and mixed solvents thereof may be preferred because they excel in solubility of the photoacid generator component of the resist.

The organic solvent may be added in an amount of from 200 to 1,000 parts by weight, especially preferably from 400 to 800 parts by weight, based on 100 parts by weight of the solid content in the resist material.

To the resist material of the invention, another polymer different from the polymer of the invention can be added.

Specific examples of such a polymer include, but not limited to, those represented by formula (R1) and/or (R2) below and having a weight-average molecular weight of from 1,000 to 100,000, preferably from 3,000 to 30,000.

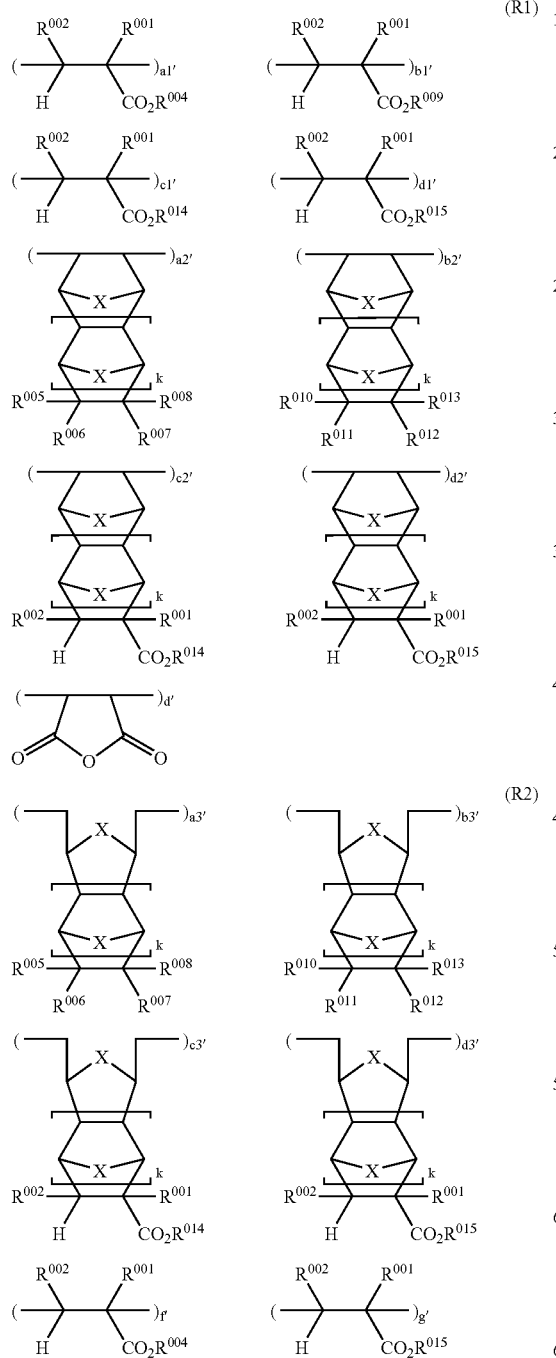

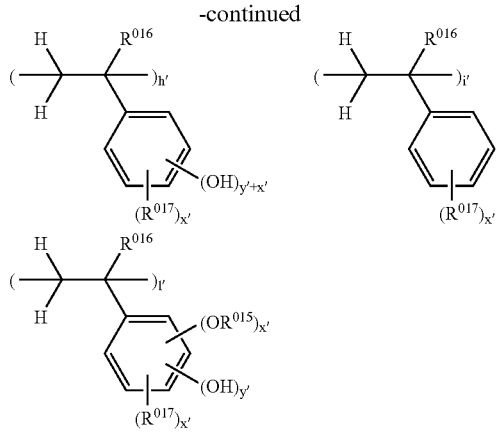

Herein, $R^{001}$ to $R^{115}$ have the same meanings as described above; $R^{016}$ represents a hydrogen atom or a methyl group; $R^{017}$ represents a linear, branched or cyclic $C_{1-8}$ alkyl group; k' stands for 0 or 1; a1', a2', a3', b1', b2', b3', c1', c2', c3', d1', d2', d3' and e' are numbers from 0 to less than 1, satisfying a1'+a2'+a3'+b1'+b2'+b3'+c1'+c2'+c3'+d1'+d2'+d3'+e'=1; f', g', h', i', and j' are numbers from 0 to less than 1, satisfying f'+g'+h'+i'+j'=1; and x', y' and z' each stands for an integer of from 0 to 3, satisfying $1 \leq x'+y'+z' \leq 5$ and $1 \leq y'+z' \leq 3$.

Specific examples of each group are similar to those described above.

The polymer of the invention and the other polymer may be mixed preferably in a weight ratio of from 100:0 to 10:90, especially preferably from 100:0 to 20:80. When the amount of the polymer of the invention is smaller than this range, the resist material thus obtained may not have desired performance. The performance of the resist material can be adjusted by changing the above ratio appropriately.

It is possible to add a plurality of the above-described polymers. The performance of the resist material can be adjusted by comprising a plurality of polymers.

The resist material of the invention may comprise a dissolution regulator further.

As the dissolution regulator, preferred is a compound containing in the molecule thereof at least two phenolic hydroxyl groups, and having from 0 to 100 mol %, on average, of the hydrogen atoms on the phenolic hydroxyl groups substituted by an acid-labile group; or a compound containing in the molecule thereof one or more carboxyl groups and having from 50 to 100 mol %, on average, of the hydrogen atoms on the carboxyl groups substituted by an acid-labile group. Both of the compounds may have an average molecular weight preferably ranging from 100 to 1,000, more preferably from 150 to 800.

The average degree of the substitution of the hydrogen atoms on the phenolic hydroxyl groups with an acid-labile group may be at least 0 mol %, preferably at least 30 mol %, of all the phenolic hydroxyl groups. The upper limit may be 100 mol %, preferably 80 mol %. The average degree of the substitution of the hydrogen atoms on the carboxyl groups with an acid-labile group may be at least 50 mol %, preferably at least 70 mol % of all the carboxyl groups, with the upper limit being 100 mol %.

As such compounds having at least two phenolic hydroxyl groups or one more carboxyl groups, compounds shown below by formulas (D1) to (D14) are preferred.

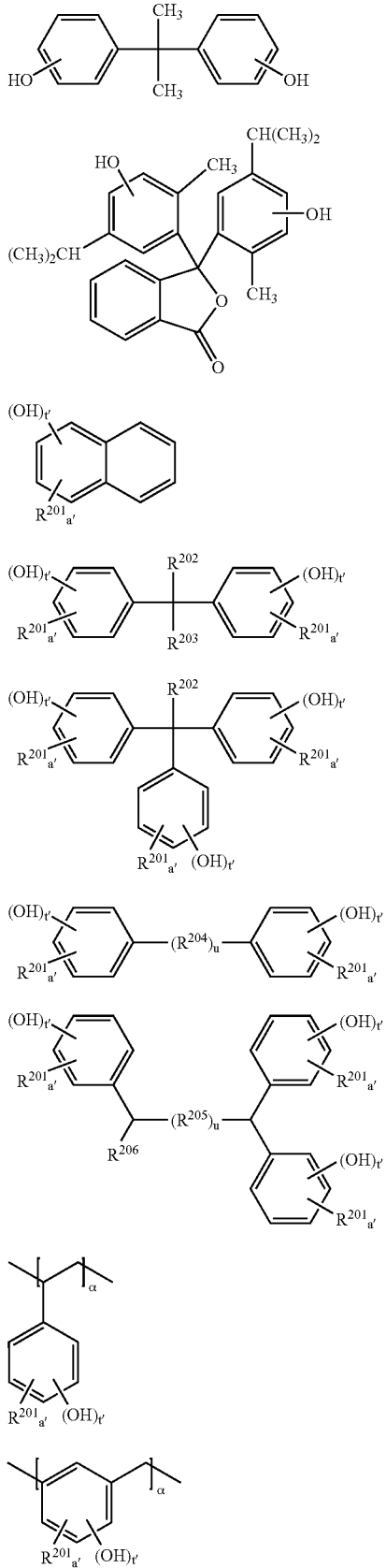

In the above formulas, $R^{201}$ and $R^{202}$ each represents a hydrogen atom or a linear or branched $C_{1-8}$ alkyl or alkenyl group and may include a hydrogen atom, methyl, ethyl, butyl, propyl, ethynyl and cyclohexyl groups.

$R^{203}$ represents a hydrogen atom, a linear or branched $C_{1-8}$ alkyl or alkenyl group, or —$(R^{207})_h$—COOH wherein $R^{207}$ represents a linear or branched $C_{1-10}$ alkylene group and may include groups similar to those exemplified as $R^{201}$ and $R^{202}$, —COOH and —CH$_2$COOH.

$R^{204}$ represents —(CH$_2$)$_i$— wherein i=2 to 10, a $C_{6-10}$ arylene group, a carbonyl group, a sulfonyl group, an oxygen atom, or a sulfur atom and may include ethylene, phenylene, carbonyl and sulfonyl groups, and oxygen and sulfur atoms.

$R^{205}$ represents a $C_{1-10}$ alkylene group, a $C_{6-10}$ arylene group, a carbonyl group, a sulfonyl group, an oxygen atom, or a sulfur atom and may include a methylene group or groups similar to those exemplified as $R^{204}$.

$R^{206}$ represents a hydrogen atom, a linear or branched $C_{1-8}$ alkyl group, alkenyl group, or a hydroxyl-substituted phenyl or naphthyl group and may include a hydrogen atom, methyl, ethyl, butyl, propyl, ethynyl and cyclohexyl groups, and a phenyl or naphthyl group substituted with a hydroxyl group.

R$^{208}$ represents a hydrogen atom or a hydroxyl group. The letter j stands for an integer from 0 to 5.

The letters u and h each stands for 0 or 1. The letters s, t, s', t', s" and t" are numbers satisfying s+t=8, s'+t'=5, and s"+t"=4, and are such that each phenyl skeleton contains at least one hydroxyl group. The letter α is a number such that the compound of formula (D8) or (D9) has a weight-average molecular weight of from 100 to 1,000.

As the acid-labile group of the dissolution regulator, various groups can be used. Examples include groups represented by formulas (L1) to (L4), tertiary $C_{4-20}$ alkyl groups, trialkylsilyl groups with each alky being a $C_{1-6}$ alkyl group and $C_{4-20}$ oxoalkyl groups. The broken line indicates the bonding position and bonding direction. Specific examples of each group are similar to those described above.

The dissolution regulator may be added in an amount of from 0 to 50 parts by weight, preferably from 0 to 40 parts by weight, more preferably from 0 to 30 parts by weight, based on 100 parts by weight of the solid content in the resist material. The dissolution regulator may be used singly or in admixture of two or more. The amount of the dissolution regulator exceeding 50 parts by weight may lead to slimming of the patterned film, and thus a decline in resolution.

The dissolution regulator as described above can be synthesized by introducing an acid-labile group into a compound having a phenolic or carboxyl group in accordance with an organic chemical method.

The resist material of the invention may comprise at least one nitrogenous organic compound.

The nitrogenous organic compound may be suitably a compound capable of suppressing a diffusion rate when an acid generated by the photoacid generator diffuses in the resist film. By incorporating the nitrogenous organic compound, the diffusion rate of the acid in the resist film can be suppressed, which leads to improvement in resolution and suppression in the sensitivity change after exposure. In addition, it reduces substrate dependence or environment dependence, as well as improving the exposure latitude and the pattern profile.

Examples of such a nitrogenous organic compound include primary, secondary and tertiary aliphatic amines, mixed amines, aromatic amines, heterocyclic amines, carboxyl-containing nitrogenous compounds, sulfonyl-containing nitrogenous compounds, hydroxyl-containing nitrogenous compounds, hydroxyphenyl-containing nitrogenous compounds, alcoholic nitrogenous compounds, amides, imides and carbamates.

Specific examples of the primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine and tetraethylenepentamine.

Examples of the secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine and N,N-dimethyltetraethylenepentamine.

Examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine and N,N,N',N'-tetramethyltetraethylenepentamine.

Examples of the mixed amines include dimethylethylamine, methylethylpropylamine, benzylamine, phenethylamine and benzyldimethylamine. Specific examples of the aromatic amine and heterocyclic amine include aniline derivatives (such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (such as pyrrole, 2H-pyrrole, 1-methylpyrrole, 2,4-dimethylpyrrole, 2,5-dimethylpyrrole, and N-methylpyrrole), oxazole derivatives (such as oxazole and isooxazole), thiazole derivatives (such as thiazole and isothiazole), imidazole derivatives (such as imidazole, 4-methylimidazole, and 4-methyl-2-phenylimidazole), pyrazole derivatives, furazan derivatives, pyrroline derivatives (such as pyrroline and 2-methyl-1-pyrroline), pyrrolidine derivatives (such as pyrrolidine, N-methylpyrrolidine, pyrrolidinone, and N-methylpyrrolidone), imidazoline derivatives, imidazolidine derivatives, pyridine derivatives (such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (such as quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives and uridine derivatives.

Examples of the carboxyl-containing nitrogenous compounds include aminobenzoic acid, indolecarboxylic acid, and amino acid derivatives (such as nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of the sulfonyl-containing nitrogenous compounds include 3-pyridinesulfonic acid and pyridinium p-toluenesulfonate.

Examples of the hydroxyl-containing nitrogenous compounds, hydroxyphenyl-containing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of the amide include formamide, N-methylformamide, N,N-dimethylformamide, acetamide, N-methylacetamide, N,N-dimethylacetamide, propionamide, benzamide and 1-cyclohexylpyrrolidone.

Examples of the imide include phthalimide, succinimide and maleimide.

Examples of the carbamate include N-t-butoxycarbonyl-N,N-dicyclohexylamine, N-t-butoxycarbonylbenzimidazole and oxazolidinone.

In addition, nitrogenous organic compounds represented by formula (B)-1 can be given as examples.

$$N(X)_n(Y)_{3-n} \quad (B)\text{-}1$$

Herein, n stands for 1, 2 or 3; the side chain Xs may be the same or different and X can be represented by formulas (X)-1 to (X)-3 below, or Xs may be coupled to form a ring; the side chain Ys are the same or different and Y represents a hydrogen atom or a linear, branched or cyclic $C_{1-20}$ alkyl group and may contain an ether or hydroxyl group.

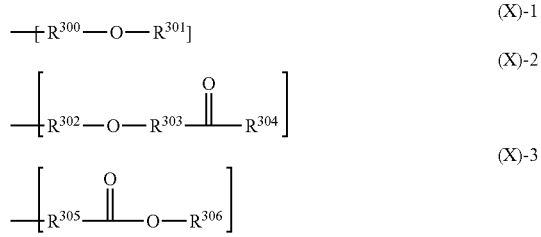

Herein, $R^{300}$, $R^{302}$ and $R^{305}$ each represents a linear or branched $C_{1-4}$ alkylene group. $R^{301}$ and $R^{304}$ each represents a hydrogen atom or a linear, branched or cyclic $C_{1-20}$ alkyl group, which may contain at least one selected from hydroxyl, ether, ester groups and lactone ring. $R^{303}$ represents a single bond or a linear or branched $C_{1-4}$ alkylene group. $R^{306}$ represents a linear, branched or cyclic $C_{1-20}$ alkyl group which may contain at least one selected from hydroxyl, ether, ester groups and lactone ring.

Specific examples of the compound represented by formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine and β-(diethylamino)-δ-valerolactone.

In addition, nitrogenous organic compounds represented by formula (B)-2 having a cyclic structure can be given as examples.

wherein X has the same meaning as described above; and $R^{307}$ represents a linear or branched $C_{2-20}$ alkylene group which may contain at least one selected from carbonyl, ether, ester groups and sulfide.

Specific examples of (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate and 2-methoxyethyl morpholinoacetate.

Also, cyano-containing nitrogenous organic compounds represented by formulas (B)-3 to (B)-6 can be given as examples.

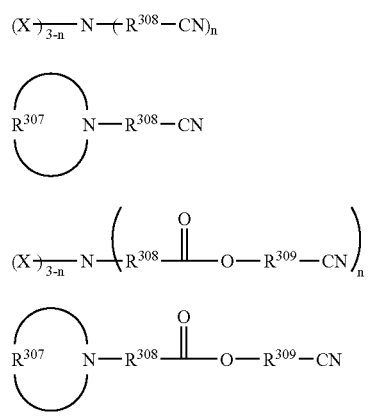

(B)-3

(B)-4

(B)-5

(B)-6 wherein X, $R^{307}$ and n have the same meanings as described above; and $R^{308}$ and $R^{309}$ are same or different and each represents a linear or branched $C_{1-4}$ alkylene group.

Specific examples of the cyano-containing nitrogenous organic compounds represented by (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

In addition, nitrogenous organic compounds represented by formula (B)-7 having an imidazole skeleton and a polar functional group can be given as examples.

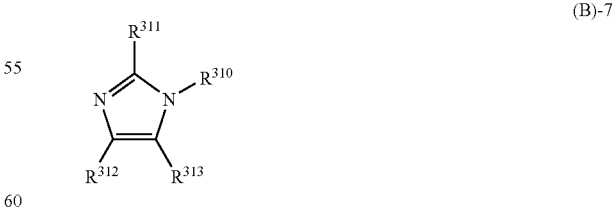

(B)-7 wherein $R^{310}$ represents a linear, branched or cyclic $C_{2-20}$ alkyl group containing at least one polar functional group such as preferred examples of hydroxyl, carbonyl, ester, ether, sulfide, carbonate, cyano and acetal; and $R^{311}$, $R^{312}$ and $R^{313}$ each represents a hydrogen atom or a linear, branched or cyclic $C_{1-10}$ alkyl, aryl or aralkyl group.

In addition, nitrogenous organic compounds represented by formula (B)-8 having a benzimidazole skeleton and a polar functional group can be given as examples.

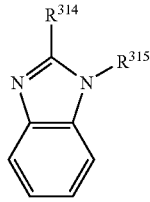

(B)-8 wherein $R^{314}$ represents a hydrogen atom, or a linear, branched or cyclic $C_{1\text{-}10}$ alkyl, aryl or aralkyl group; and $R^{315}$ represents a linear, branched or cyclic $C_{1\text{-}20}$ alkyl group having at least one polar functional group such as preferred examples of ester, acetal and cyano wherein functional group may further contain at least one hydroxyl group, carbonyl group, ether group, sulfide group or carbonate group.

In addition, nitrogenous heterocyclic compounds represented by formula (B)-9 or (B)-10 having a polar functional group can be given as examples.

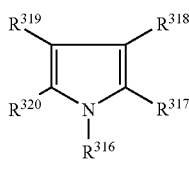

(B)-9

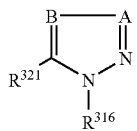

(B)-10 wherein A represents a nitrogen atom or $\equiv$C—$R^{322}$ B represents a nitrogen atom or $\equiv$C—$R^{323}$; $R^{316}$ represents a linear, branched or cyclic $C_{2\text{-}20}$ alkyl group having at least one polar functional group such as preferred examples of hydroxyl, carbonyl, ester, ether, sulfide, carbonate, cyano and acetal; $R^{317}$, $R^{318}$, $R^{319}$ and $R^{320}$ each represents a hydrogen atom or a linear, branched or cyclic $C_{1\text{-}10}$ alkyl or aryl group, or $R^{317}$ and $R^{318}$, or $R^{319}$ and $R^{320}$ may be coupled to form a benzene, naphthalene or pyridine ring; $R^{321}$ represents a hydrogen atom or a linear, branched or cyclic $C_{1\text{-}10}$ alkyl or aryl group; and $R^{322}$ and $R^{323}$ each represents a hydrogen atom or a linear, branched or cyclic $C_{1\text{-}10}$ alkyl or aryl group, or $R^{322}$ and $R^{323}$ may be coupled to form a benzene or naphthalene ring.

The nitrogenous organic compound may be added preferably in an amount of from 0.001 to 2 parts by weight, especially preferably from 0.01 to 1 part by weight, based on 100 parts by weight of the solid content in the resist material. When the amount is less than 0.001 part by weight, the compound may not bring the desired effect. When the amount exceeds 2 parts by weight, sensitivity may lower excessively.

The resist material of the invention may comprise a compound containing, in the molecule thereof, a group represented by $\equiv$C—COOH. The compound containing, in the molecule thereof, a group represented by $\equiv$C—COOH, may include, but not limited to, at least one compound selected from the following Group I and Group II. Addition of this compound can improve the PED stability of the resist and ameliorate edge roughness on a nitride film substrate.

[Group I]

Compounds obtained by substituting part or all of the hydrogen atoms on the phenolic hydroxyl groups of the compounds of formulas (A1) to (A10) below by —$R^{401}$— COOH (wherein $R^{401}$ represents a linear or branched $C_{1\text{-}10}$ alkylene group), and having a molar ratio C/(C+D) of phenolic hydroxyl groups (C) to $\equiv$C—COOH groups (D) in the molecule falling within range of from 0.1 to 1.0.

[Group II]

Compounds represented by formulas (A11) to (A15):

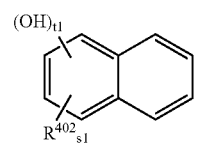

A1

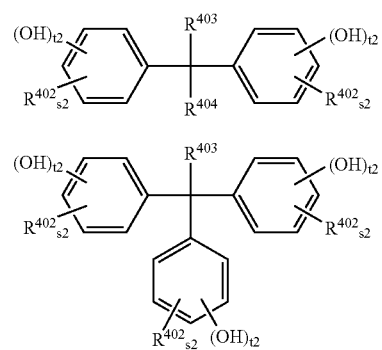

A2

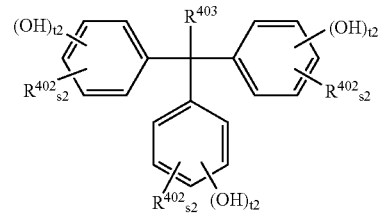

A3

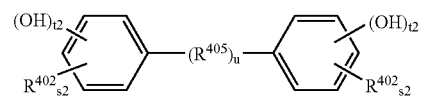

A4

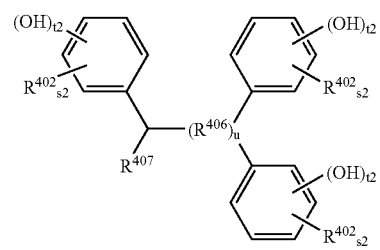

A5

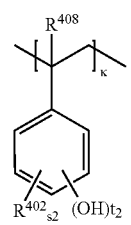

A6

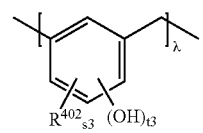

A7

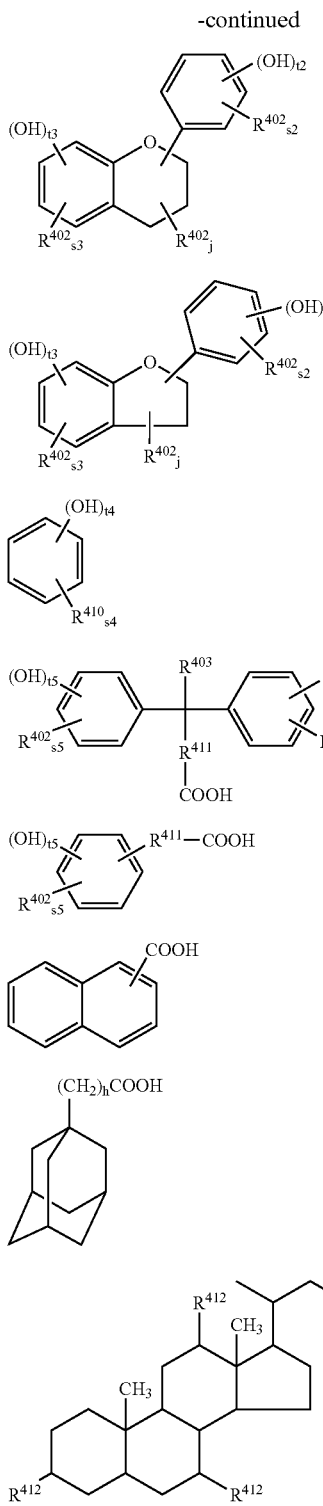

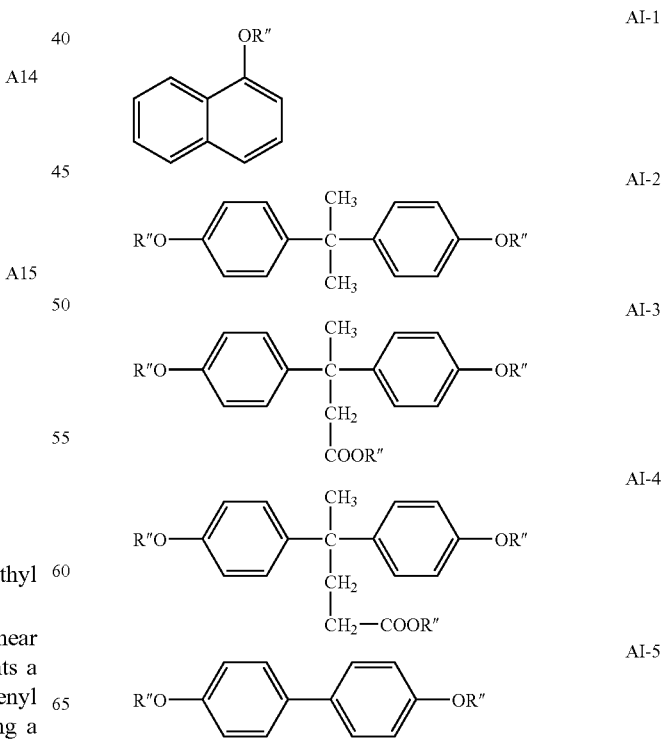

$R^{405}$ represents $(CH_2)_i$-wherein i stands for 2 to 10, a $C_{6-10}$ arylene group, a carbonyl group, a sulfonyl group, an oxygen atom or a sulfur atom.

$R^{406}$ represents a $C_{1-10}$ alkylene group, a $C_{6-10}$ arylene group, a carbonyl group, a sulfonyl group, an oxygen atom or a sulfur atom.

$R^{407}$ represents a hydrogen atom, a linear or branched $C_{1-8}$ alkyl group, an alkenyl group, or a hydroxyl-substituted phenyl or naphthyl group.

$R^{409}$ represents a linear or branched $C_{1-10}$ alkyl or alkenyl group, or —$R^{411}$—COOH group wherein $R^{411}$ represents a linear or branched $C_{1-10}$ alkylene group.

$R^{410}$ represents a hydrogen atom, a linear or branched $C_{1-8}$ alkyl or alkenyl group, or —$R^{411}$—COOH group wherein $R^{411}$ represents a linear or branched $C_{1-10}$ alkylene group.

$R^{412}$ represents a hydrogen atom or a hydroxyl group.

The letter j stands for an integer from 0 to 3; s4, and t4 are numbers which satisfy s1+t1=8, s2+t2=5, s3+t3=4, and s4+t4=6, and are such that each phenyl skeleton has at least one hydroxyl group.

The letters s5 and t5 stand for numbers which satisfy s5≧0, t5≧0 and s5+t5=5.

The letter u stands for a number satisfying 1≦u≦4, while the letter h stands for a number satisfying 1≦h≦4.

The letter κ stands for a number by which the compound of formula (A6) has a weight-average molecular weight of from 1,000 to 5,000.

The letter λ stands for a number by which the compound of formula (A7) has a weight-average molecular weight of from 1,000 to 10,000.

Specific examples of this component include, but not limited to, compounds represented by formulas AI-1 to AI-14 and AII-1 to AII-10:

Herein, $R^{408}$ represents a hydrogen atom or a methyl group.

$R^{402}$ and $R^{403}$ each represents a hydrogen atom or a linear or branched $C_{1-8}$ alkyl or alkenyl group. $R^{404}$ represents a hydrogen atom, a linear or branched $C_{1-8}$ alkyl or alkenyl group, or a —$(R^{409})_h$—COOR' group wherein R' being a hydrogen atom or —$R^{409}$—COOH.

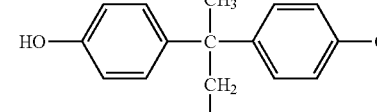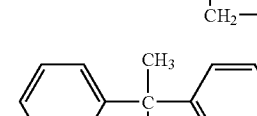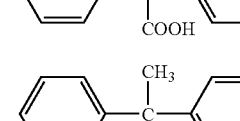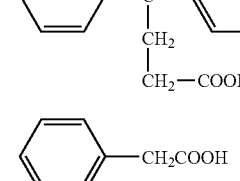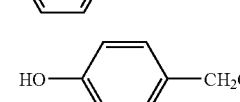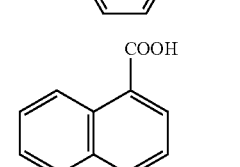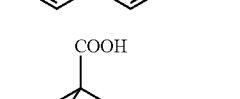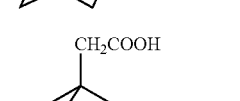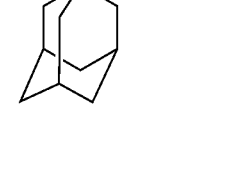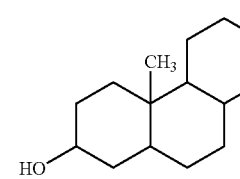
wherein R″ represents a hydrogen atom or a $CH_2COOH$ group such that the $CH_2COOH$ group accounts for 10 to 100 mol % of R″ in each compound, and κ and λ have the same meanings as described above.

The compound having in the molecule thereof a ≡C—COOH group may be added in an amount of from 0 to 5 parts, preferably from 0.1 to 5 parts by weight, more preferably from 0.1 to 3 parts by weight, still more preferably from 0.1 to 2 parts by weight based on 100 parts by weight of the solid content in the resist material. When the amount exceeds 5 parts by weight, the resolution of the resist material may lower.

The resist material of the invention may comprise an acetylene alcohol derivative as an additive for improving the shelf stability.

The acetylene alcohol derivative may preferably include those represented by formula (S1) or (S2):

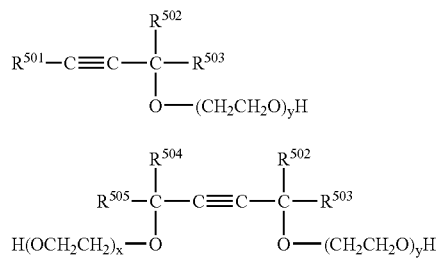

wherein $R^{501}$, $R^{502}$, $R^{503}$, $R^{504}$, and $R^{505}$ each represents a hydrogen atom or a linear, branched or cyclic $C_{1-8}$ alkyl group, and X and Y each stands for 0 or a positive number, satisfying $0 \leq X \leq 30$, $0 \leq Y \leq 30$, and $0 \leq X+Y \leq 40$.

Preferable examples of the acetylene alcohol derivative include "Surfynol 61", "Surfynol 82", "Surfynol 104", "Surfynol 104E", "Surfynol 104H", "Surfynol 104A", "Surfynol TG", "Surfynol PC", "Surfynol 440", "Surfynol 465", and "Surfynol 485" (trade names; products of Air Products and Chemicals Inc.) and "Surfynol E1004" (trade name; product of Nisshin Chemical Industry).

The acetylene alcohol derivative may be added preferably in an amount of from 0.01 to 2 wt %, more preferably from 0.02 to 1 wt %, based on 100 wt % of the resist material. When the amount is less than 0.01 wt %, it may be ineffective for improving coating characteristics and shelf stability. When it exceeds 2 wt %, the resolution of the resist material may lower.

The resist material of the invention may comprise, in addition to the above-described components, an ordinarily employed surfactant as an optional component for improving the coating characteristics. The optional component may be added in a conventional amount within a range not disturbing the effect of the invention.

Nonionic surfactants are preferred as the surfactant and examples include perfluoroalkylpolyoxyethylene ethanols, fluorinated alkyl esters, perfluoroalkylamine oxides, perfluoroalkyl EO-addition products and fluorine-containing organosiloxane compounds. Specific examples include "Florad FC-430 and FC-431" (products of Sumitomo 3M Ltd.), "Surflon S-141, S-145, KH-10, KH-20, KH-30 and KH-40" (products of Asahi Glass, Co., Ltd.), "Unidain DS-401, DS-403 and DS-451" (products of Daikin Industries, Ltd.), "Megafac F-8151" (product of Dai-Nippon Ink & Chemicals, Inc.) and "X-70-092 and X-70-093" (products of Shin-Etsu Chemical Co., Ltd.). "Florade FC-430" (product of Sumitomo 3M Ltd.), "KH-20 and KH-30" (products of Asahi Glass) and "X-70-093" (product of Shin-Etsu Chemical Co., Ltd.) are preferred.

Pattern formation using the resist material of the invention can be carried out by known lithography. For example, the resist material is applied onto a substrate such as a silicon wafer by spin-coating to form a film having a thickness of from 0.1 to 2.0 μm. The film is then pre-baked on a hot plate at from 60 to 150° C. for from 1 to 10 minutes, preferably at from 80 to 130° C. for from 1 to 5 minutes. A mask having a desired pattern is then placed on or above the resist film, which is then subjected to exposure through the mask to high-energy radiation such as deep-UV ray, an excimer laser or x-rays or to an electron beam in a dose of from about 1 to 200 mJ/cm², preferably from about 5 to 100 mJ/cm². The resulting film is then post-exposure baked (PEB) on a hot plate at from 60 to 150° C. for from 1 to 5 minutes, preferably at from 80 to 130° C. for from 1 to 3 minutes. It is then developed using as the developer an aqueous alkali solution such as an aqueous 0.1 to 5 wt %, preferably 2 to 3 wt % solution of tetramethylammonium hydroxide (TMAH) in a conventional manner such as dipping, puddling or spraying for from 0.1 to 3 minutes, preferably from 0.5 to 2 minutes. By these steps, the desired pattern is formed on or above the substrate. The material of the invention is best suited for fine pattern formation by high-energy radiation, in particular, deep-UV ray having a wavelength of from 248 to 193 nm, an excimer laser, X-ray or an electron beam. When the conditions are outside the above-described range and exceed the upper limit or fall below the lower limit, the desired pattern may not be obtained.

The invention will hereinafter be described in detail by Synthesis Examples and Examples. However, it should not be construed that the invention is limited to them.

SYNTHESIS EXAMPLE

The polymer of the invention was synthesized in accordance with formulation.

Synthesis Example 1

Synthesis of Polymer 1

In 150 g of methyl ethyl ketone were dissolved 15.00 g (82.3 mmol) of 1-ethyl-1-cyclopentyl methacrylate, 13.90 g (58.8 mmol) of 3-hydroxy-1-adamantyl methacrylate, 21.10 g (94.1 mmol) of 4,8-dioxa-5-oxotricyclo[4.2.1.0³·⁷]nonan-2-yl methacrylate, 1.51 g (9.17 mmol) of 2,2'-azobisisobutyronitrile and 0.184 g (2.35 mmol) of 2-mercaptoethanol. Under a nitrogen gas stream, the resulting solution was added dropwise in 4 hours to 50 g of methyl ethyl ketone heated to 80° C. After completion of the dropwise addition, the reaction mixture was stirred under heating at 80° C. for 2 hours under a nitrogen gas stream. After completion of the reaction, the reaction mixture was cooled to room temperature. The resulting reaction mixture was added dropwise to 0.75 L of hexane under vigorous stirring to cause precipitation. The solid thus obtained was filtered, and dried under vacuum at 50° C. for 15 hours, whereby 43.83 g of a white solid was obtained in a yield of 87.7%. As a result of GPC and ¹³C NMR analysis, the resulting white solid was confirmed to be a polymer represented by formula of Polymer 1 below. The Mw means a weight-average molecular weight of the polymer based on measurement of gel permeation chromatography (GPC) using polystyrene as a standard.

Synthesis Examples 2 to 32
Synthesis of Polymers 2 to 32
Polymers 2 to 32 were synthesized in a similar manner to Synthesis Example 1 or in a known manner.
(Polymer 1)
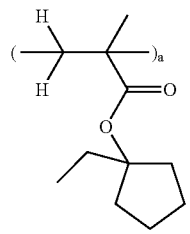
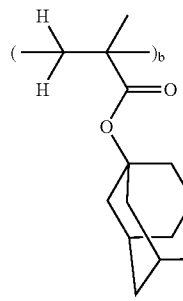
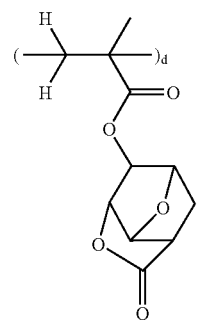
(a = 0.35, b = 0.25, d = 0.40, Mw = 5700)
(Polymer 2)
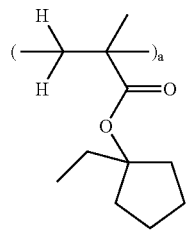
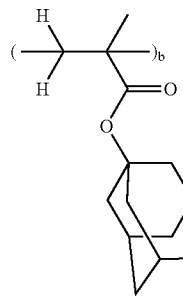
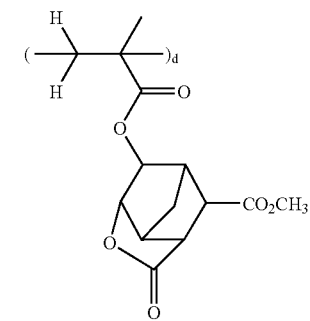
(a = 0.35, b = 0.25, d = 0.40, Mw = 5600)
-continued
(Polymer 3)
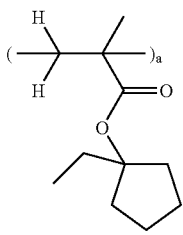
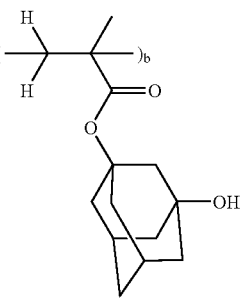
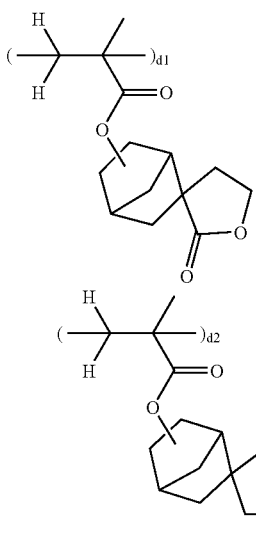
(a = 0.35, b = 0.25, d1 + d2 = 0.40, Mw = 5500)
(Polymer 4)
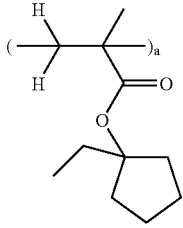
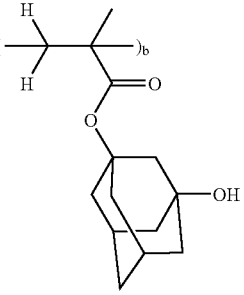
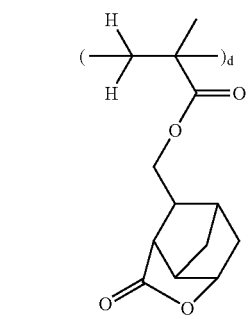
(a = 0.35, b = 0.25, d = 0.40, Mw = 6100)

(Polymer 5)
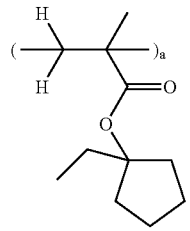 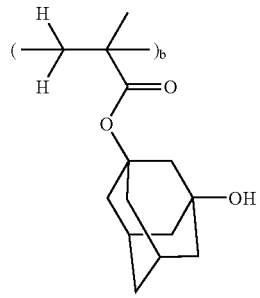
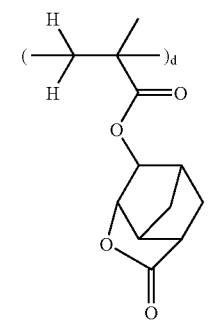
(a = 0.35, b = 0.25, d = 0.40, Mw = 6000)
(Polymer 6)
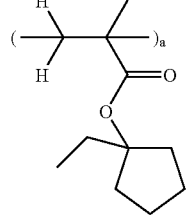 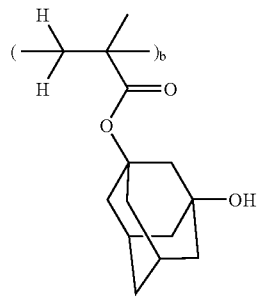
(a = 0.35, b = 0.25, d = 0.40, Mw = 6000)
(Polymer 7)
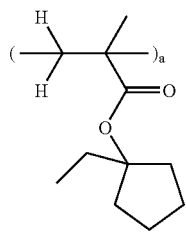 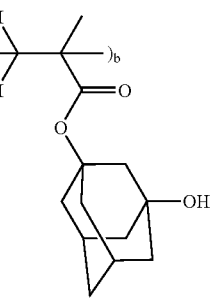
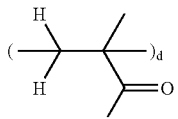
(a = 0.35, b = 0.25, d = 0.40, Mw = 5900)
(Polymer 8)
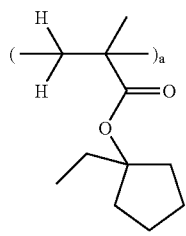 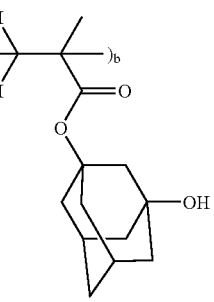
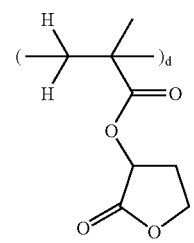
(a = 0.35, b = 0.25, d = 0.40, Mw = 6100)
(Polymer 9)
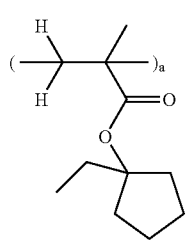 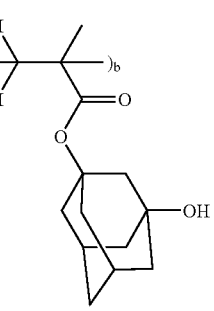

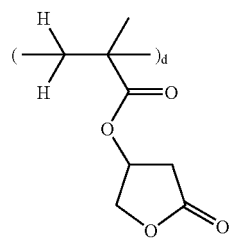
(a = 0.35, b = 0.25, d = 0.40, Mw = 6000)
(Polymer 10)
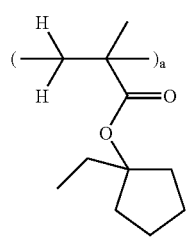
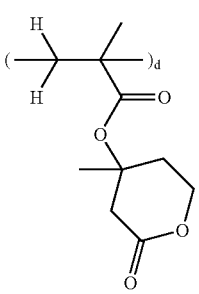
(a = 0.35, b = 0.25, d = 0.40, Mw = 5900)
(Polymer 11)
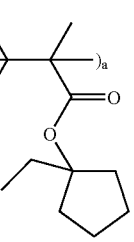
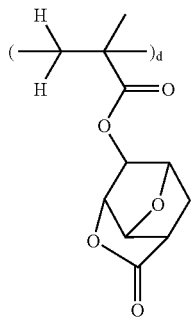
(a = 0.35, b = 0.25, d = 0.40, Mw = 5700)
(Polymer 12)
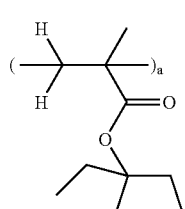
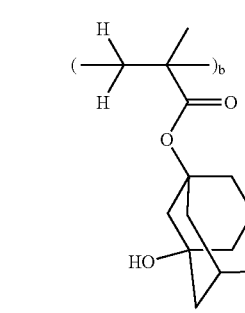
(a = 0.35, b = 0.25, d = 0.40, Mw = 6000)
(Polymer 13)
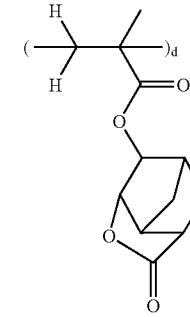
(a = 0.35, b = 0.25, d = 0.40, Mw = 6000)

-continued
(Polymer 14)
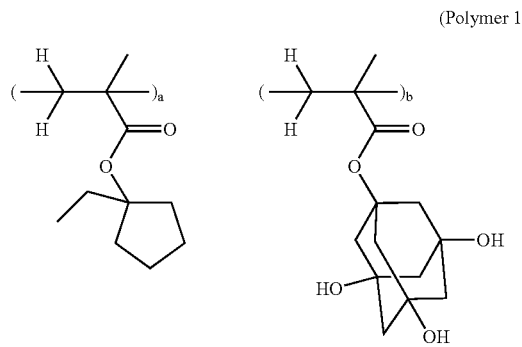
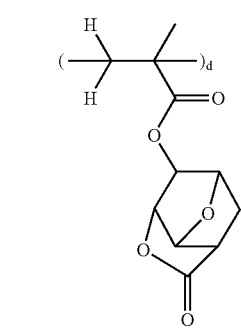
(a = 0.35, b = 0.25, d = 0.40, Mw = 5700)
(Polymer 15)
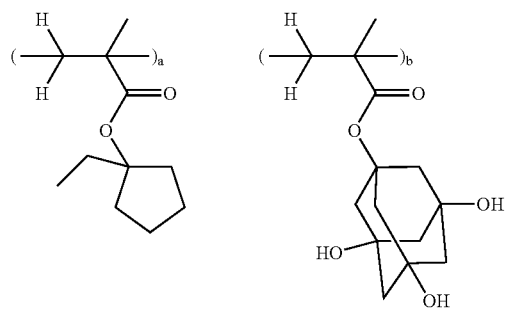
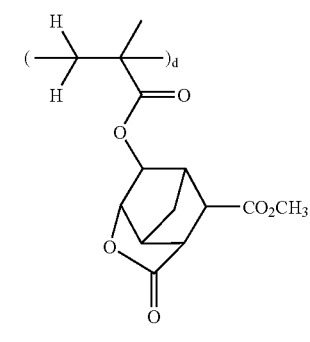
(a = 0.35, b = 0.25, d = 0.40, Mw = 6000)
-continued
(Polymer 16)
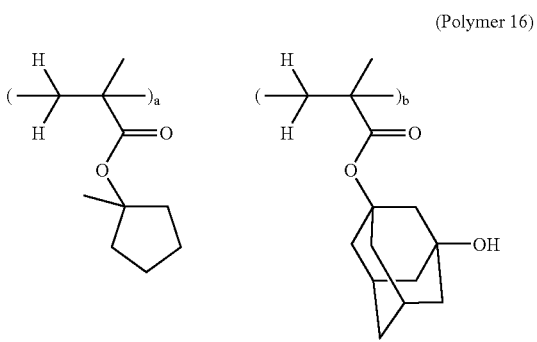
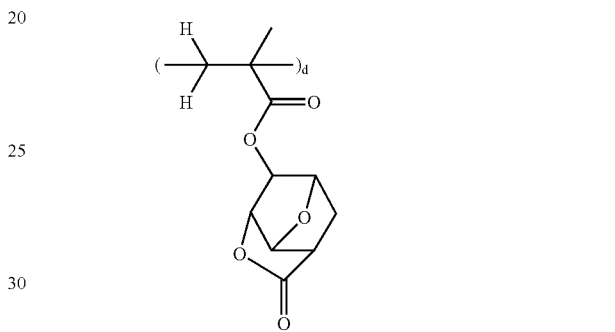
(a = 0.35, b = 0.25, d = 0.40, Mw = 6900)
(Polymer 17)
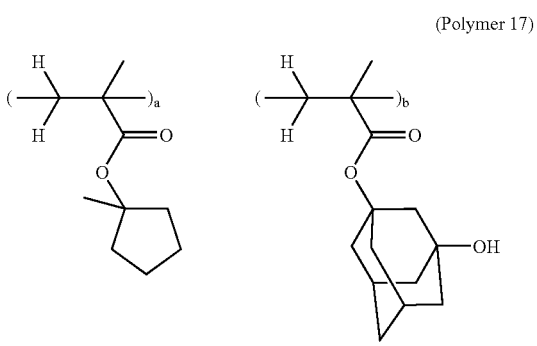
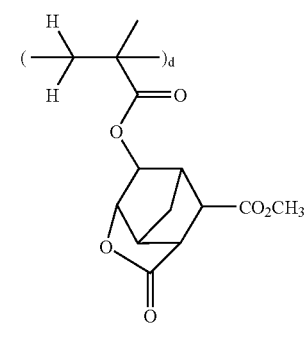
(a = 0.35, b = 0.25, d = 0.40, Mw = 6500)

(Polymer 18)
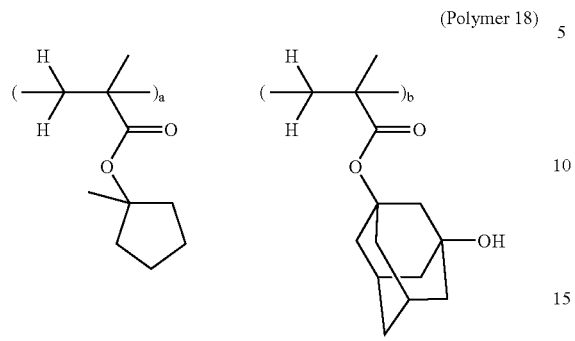
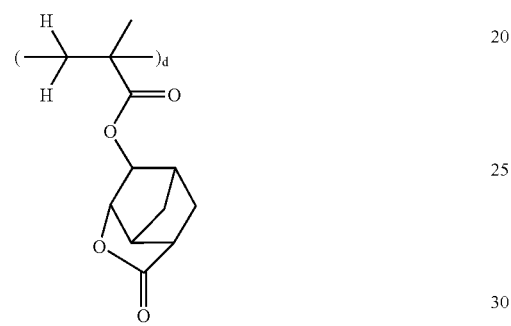
(a = 0.35, b = 0.25, d = 0.40, Mw = 6800)
(Polymer 19)
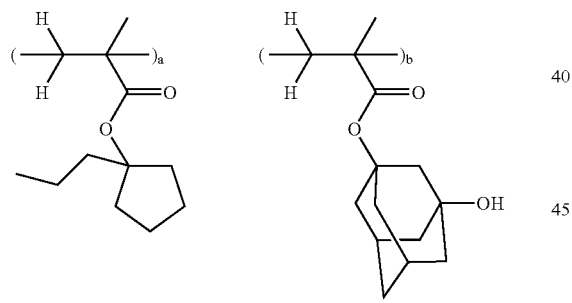
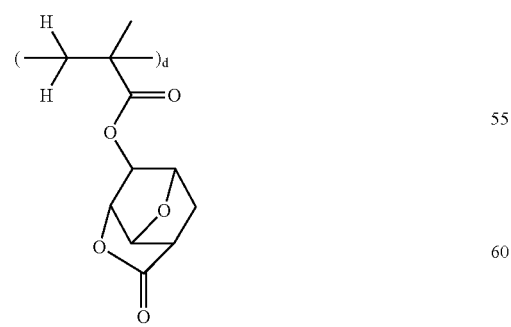
(a = 0.35, b = 0.25, d = 0.40, Mw = 6200)
(Polymer 20)
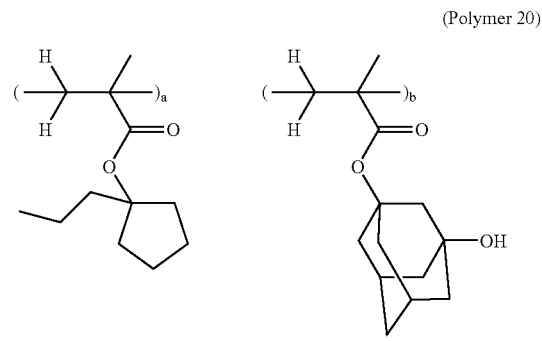
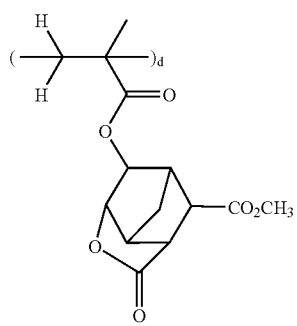
(a = 0.35, b = 0.25, d = 0.40, Mw = 6000)
(Polymer 21)
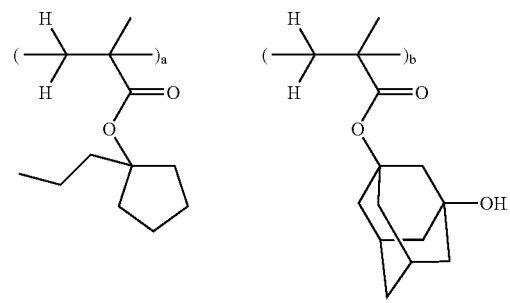
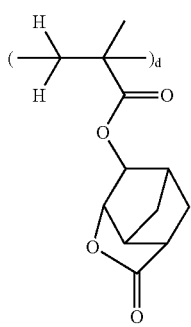
(a = 0.35, b = 0.25, d = 0.40, Mw = 6300)

(Polymer 22)
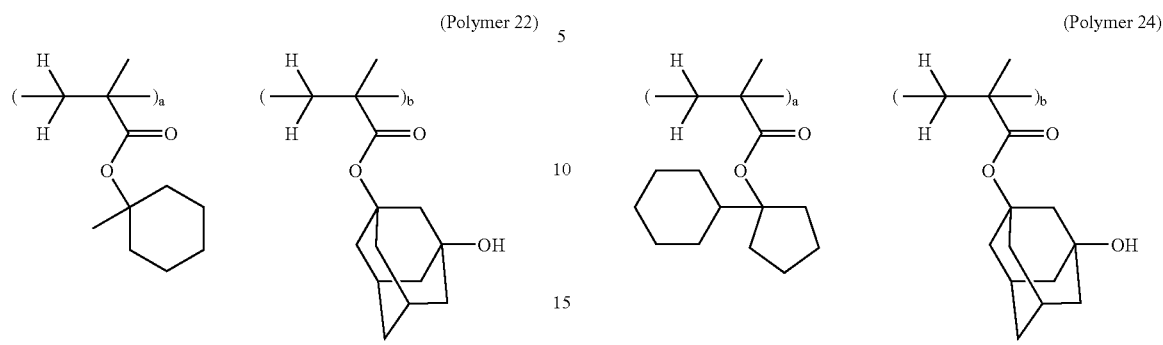
(a = 0.35, b = 0.25, d = 0.40, Mw = 6800)
(Polymer 23)
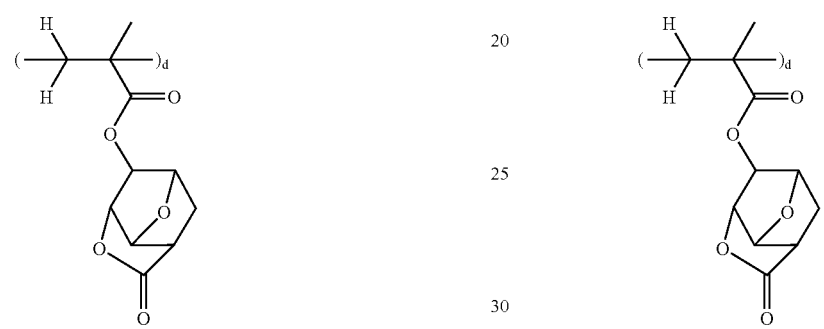
(a = 0.35, b = 0.25, d = 0.40, Mw = 6200)
(Polymer 24)
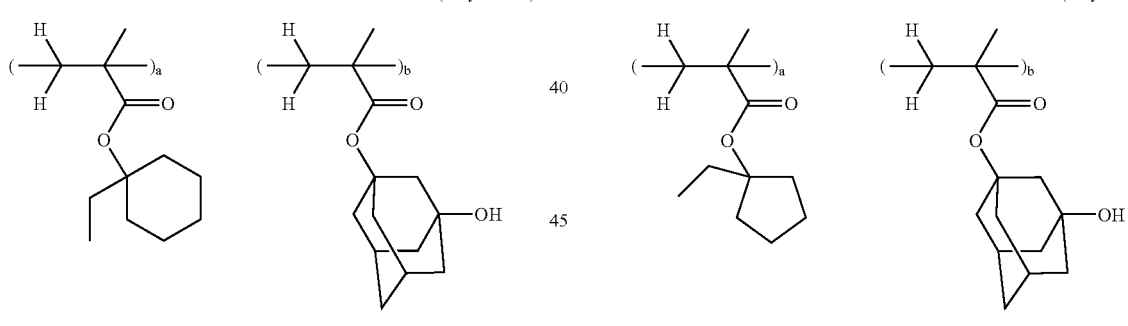
(a = 0.35, b = 0.25, d = 0.40, Mw = 7100)
(Polymer 25)
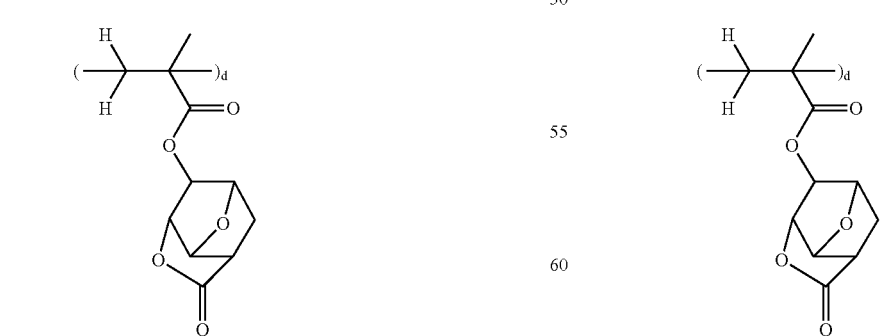
(a = 0.40, b = 0.25, d = 0.35, Mw = 6500)

(Polymer 26)
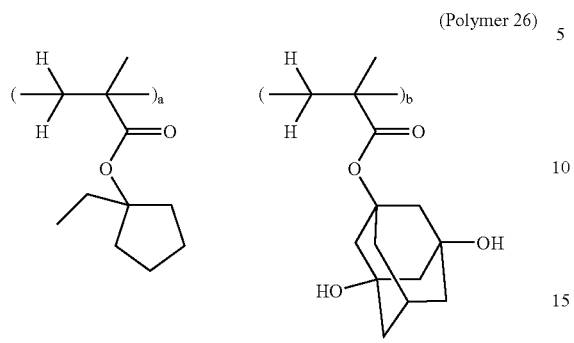
(a = 0.40, b = 0.25, d = 0.35, Mw = 6000)
(Polymer 28)
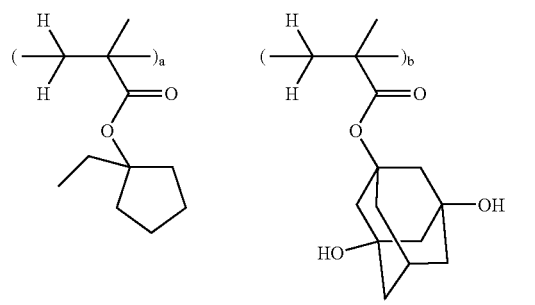
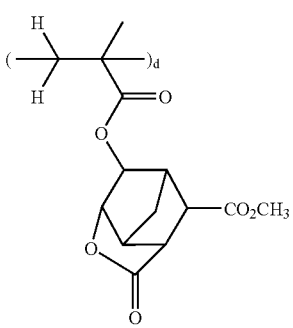
(a = 0.40, b = 0.25, d = 0.35, Mw = 5700)
(Polymer 27)
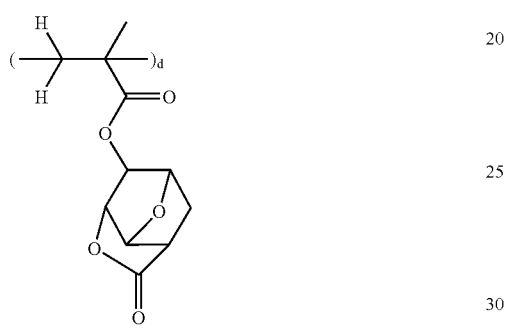
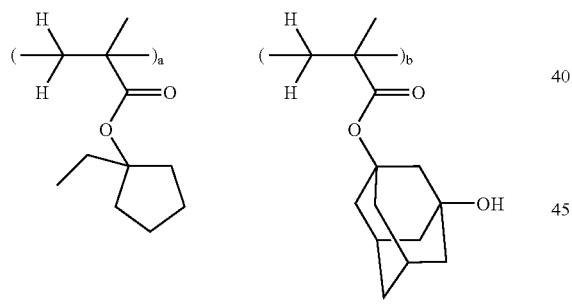
(a = 0.40, b = 0.25, d = 0.35, Mw = 6100)
(Polymer 29)
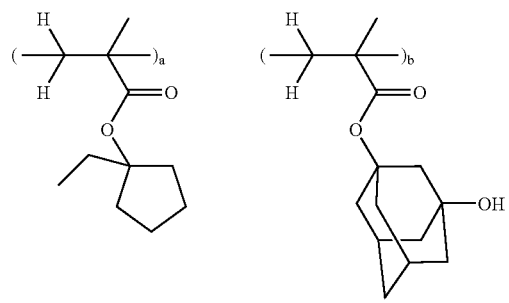
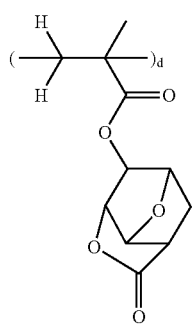
(a = 0.50, b = 0.20, d = 0.30, Mw = 6800)

-continued (Polymer 30)

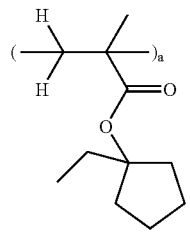 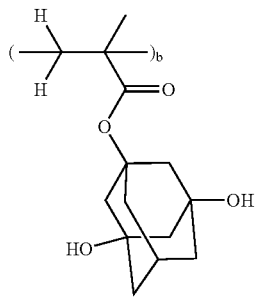

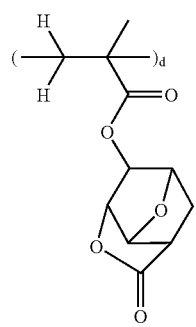

(a = 0.50, b = 0.20, d = 0.30, Mw = 6500)

(Polymer 31)

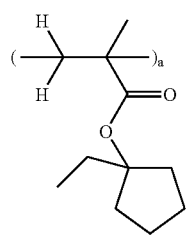 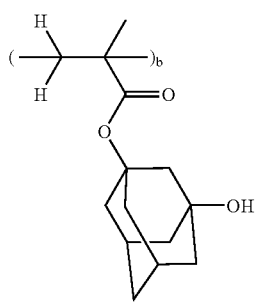

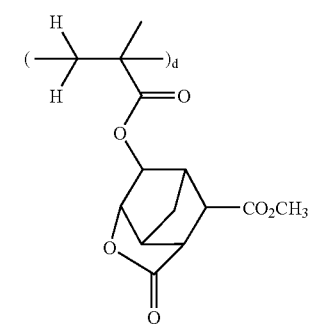

(a = 0.50, b = 0.20, d = 0.30, Mw = 6700)

-continued (Polymer 32)

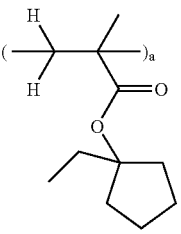 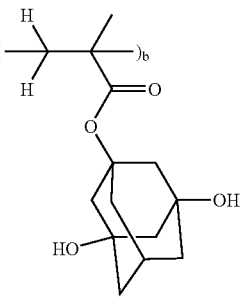

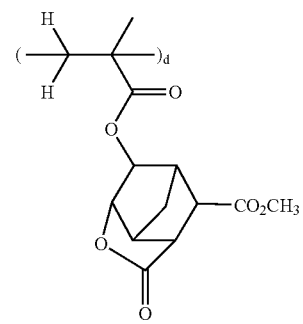

(a = 0.50, b = 0.20, d = 0.30, Mw = 6800)

Synthesis Example 33

Synthesis of Polymer 33

In 100 g of methyl ethyl ketone were dissolved 12.45 g (68.3 mmol) of 1-ethyl-1-cyclopentyl methacrylate, 6.25 g (22.8 mmol) of 4-ethyl-teteracyclo[4.4.0.1$^{2.5}$.1$^{7.10}$]dodeca-nyl methacrylate, 13.45 g (56.9 mmol) of 3-hydroxy-1-adamantyl methacrylate, 17.86 g (79.7 mmol) of 4,8-dioxa-5-oxotricyclo[4.2.1.0$^{3.7}$]nonane-2-yl methacrylate, 1.46 g (8.88 mmol) of 2,2'-azobisisobutyronitrile and 0.178 g (2.28 mmol) of 2-mercaptoethanol. Under a nitrogen gas stream, the resulting solution was added dropwise in 4 hours to 50 g of methyl ethyl ketone heated to 80° C. After completion of the dropwise addition, the reaction mixture was stirred under heating at 80° C. for 2 hours under a nitrogen gas stream. After completion of the reaction, the reaction mixture was cooled to room temperature. The resulting reaction mixture was added dropwise to 1.5 L of hexane under vigorous stirring to cause precipitation. The solid thus obtained was filtered, and dried under vacuum at 50° C. for 15 hours, whereby 41.95 g of a white solid was obtained in a yield of 83.9%. As a result of GPC and $^{13}$C NMR analysis, the resulting white solid was confirmed to be a polymer represented by formula of Polymer 33 below. The Mw means a weight-average molecular weight of the polymer based on measurement of GPC using polystyrene as a standard.

Synthesis Examples 34 to 50

Synthesis of Polymers 34 to 50

In a similar manner to Synthesis Example 33 or in a known manner, Polymers 34 to 50 were synthesized.

(Polymer 33)
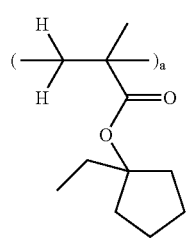
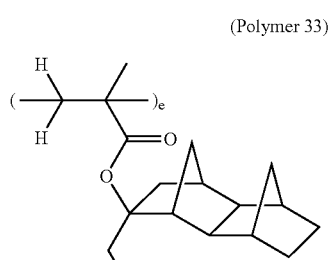
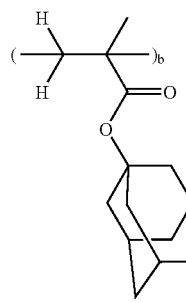
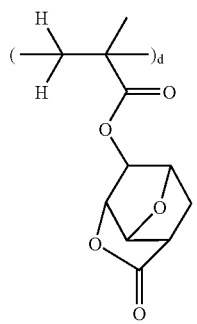
(a = 0.30, e = 10, b = 0.25, d = 0.35, Mw = 6800)
(Polymer 34)
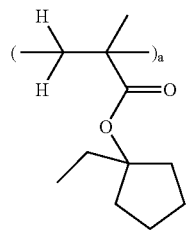
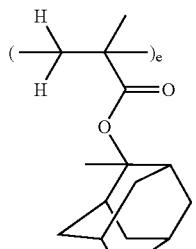
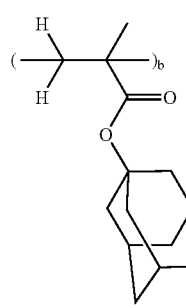
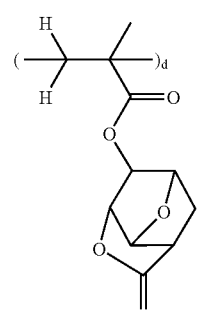
(a = 0.30, e = 10, b = 0.25, d = 0.35, Mw = 7100)
(Polymer 35)
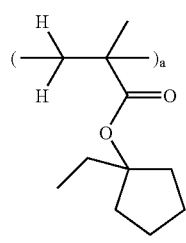
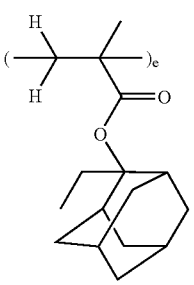
-continued
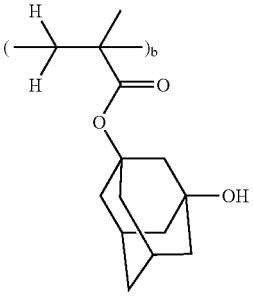
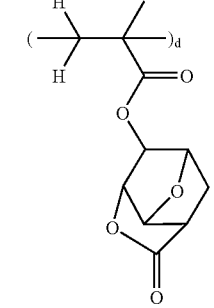
(a = 0.30, e = 10, b = 0.25, d = 0.35, Mw = 5700)
(Polymer 36)
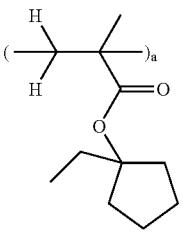
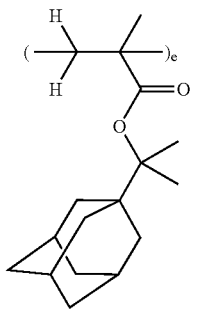
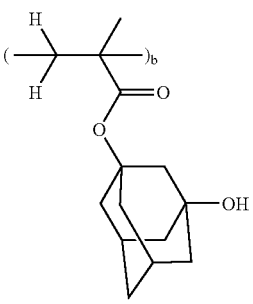
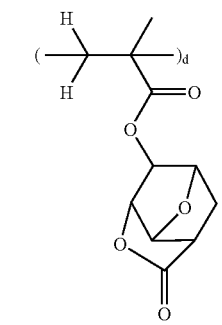
(a = 0.30, e = 10, b = 0.25, d = 0.35, Mw = 7300)
(Polymer 37)
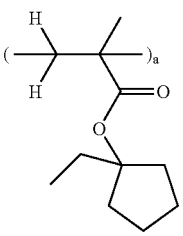
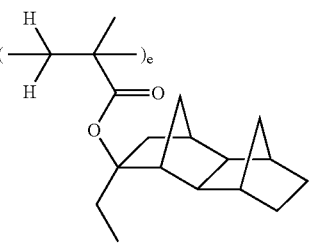
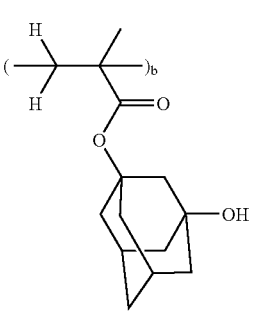

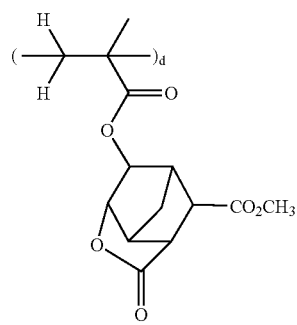
(a = 0.30, e = 10, b = 0.25, d = 0.35, Mw = 6700)
(Polymer 38)
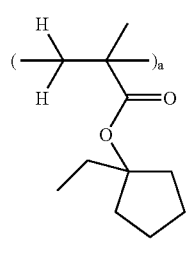 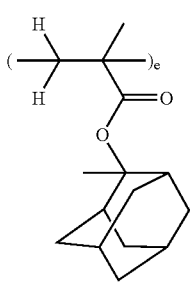
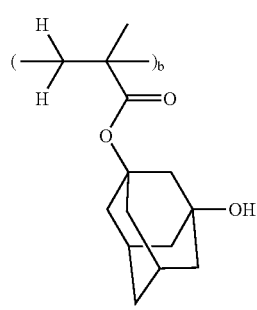
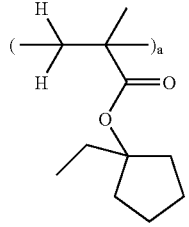 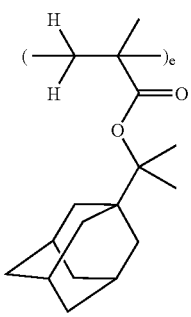
(a = 0.30, e = 10, b = 0.25, d = 0.35, Mw = 7300)
(Polymer 39)
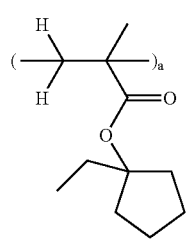 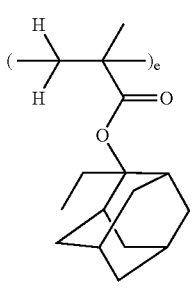
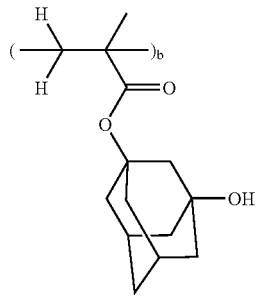
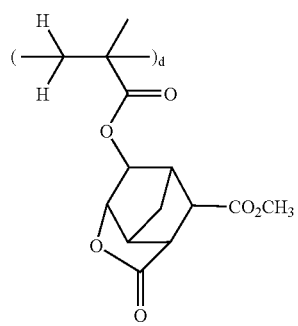
(a = 0.30, e = 10, b = 0.25, d = 0.35, Mw = 5800)
(Polymer 40)
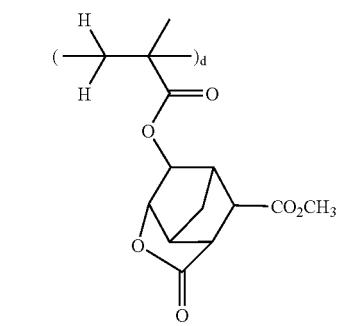
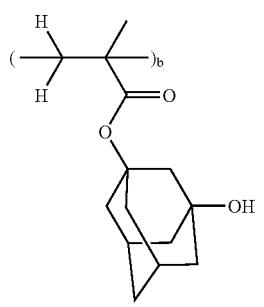
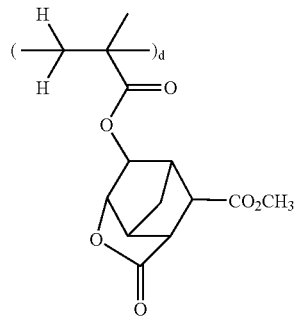
(a = 0.30, e = 10, b = 0.25, d = 0.35, Mw = 7600)

-continued
(Polymer 41)
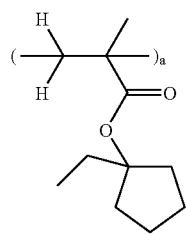 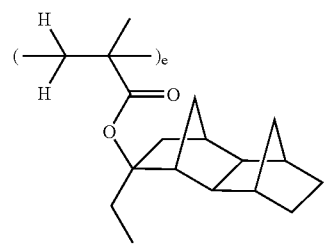
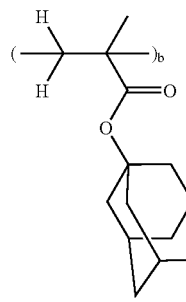 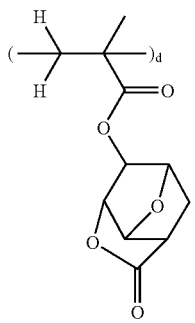
(a = 0.10, e = 25, b = 0.25, d = 0.40, Mw = 6100)
(Polymer 42)
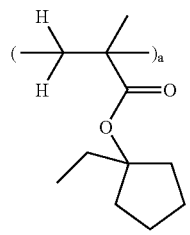 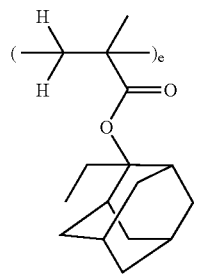
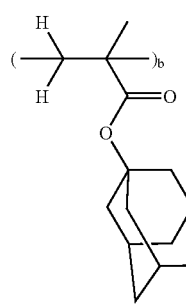 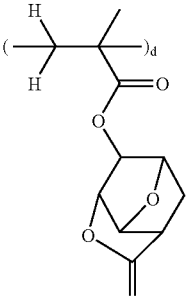
(a = 0.10, e = 25, b = 0.25, d = 0.40, Mw = 5600)
(Polymer 43)
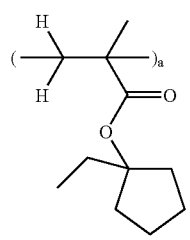 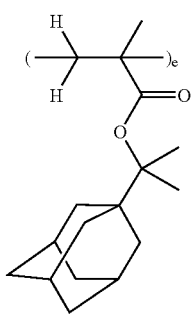
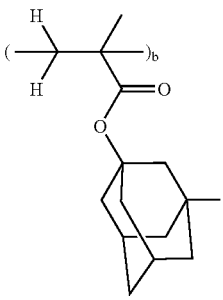 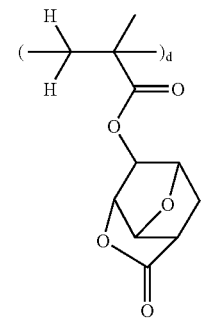
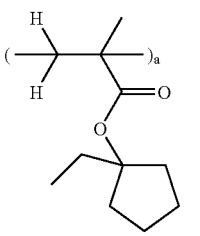 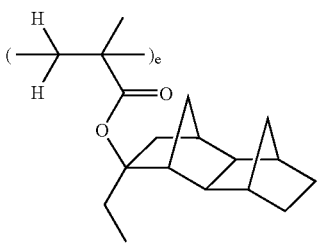
(a = 0.10, e = 25, b = 0.25, d = 0.40, Mw = 6700)
(Polymer 44)
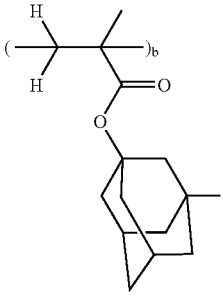 (reuse e unit)
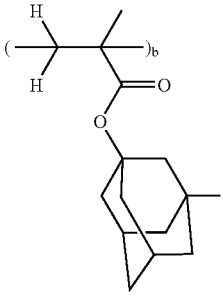 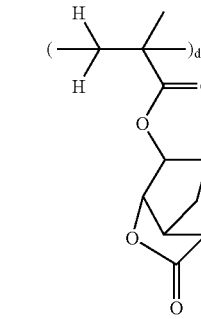
(a = 0.10, e = 25, b = 0.25, d = 0.40, Mw = 5900)
(Polymer 45)
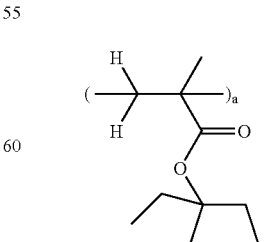 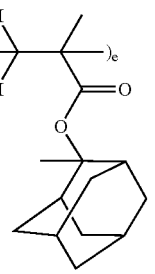

-continued
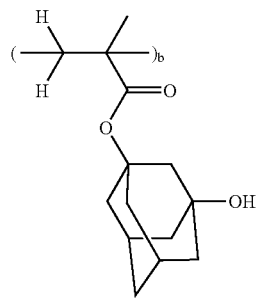
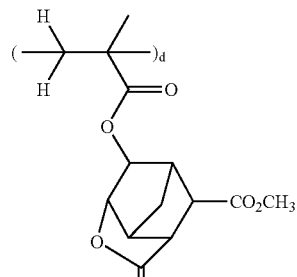
(a = 0.10, e = 25, b = 0.25, d = 0.40, Mw = 6300)
(Polymer 46)
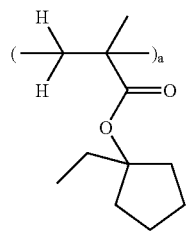 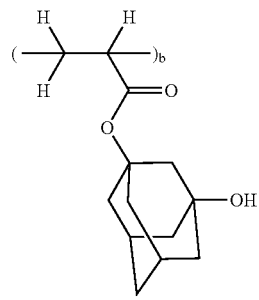
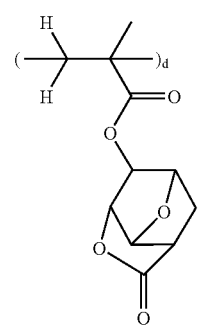
(a = 0.35, b = 0.25, d = 0.40, Mw = 6700)
(Polymer 47)
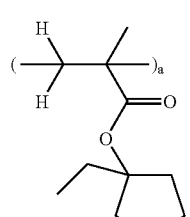 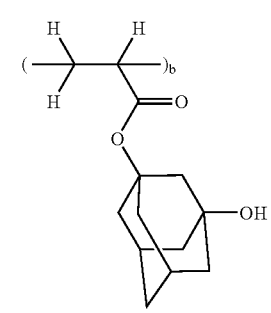
-continued
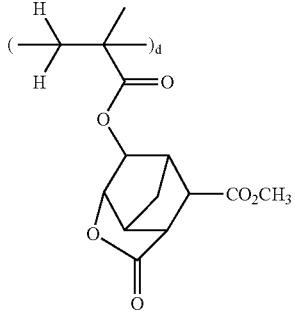
(a = 0.35, b = 0.25, d = 0.40, Mw = 6300)
(Polymer 48)
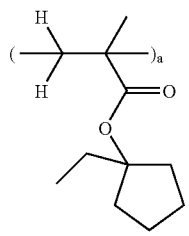 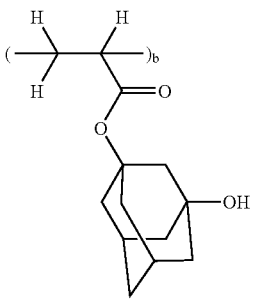
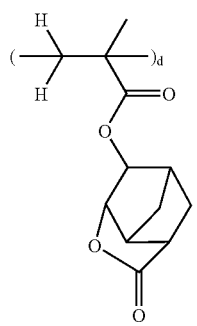
(a = 0.35, b = 0.25, d = 0.40, Mw = 6700)
(Polymer 49)
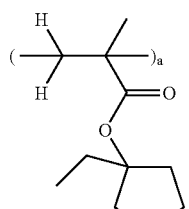 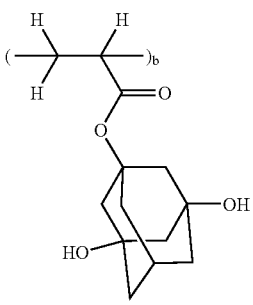

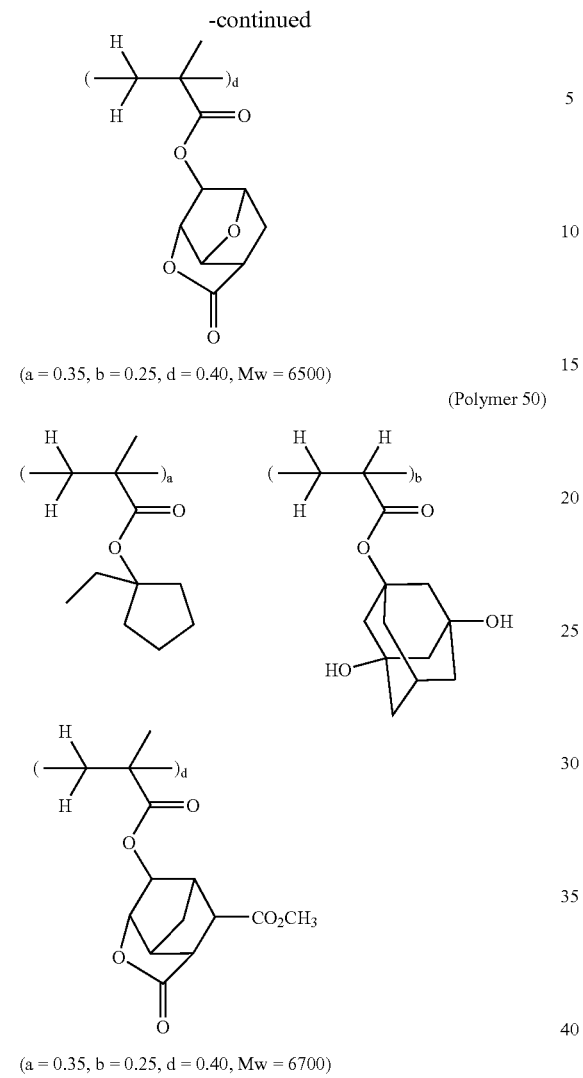

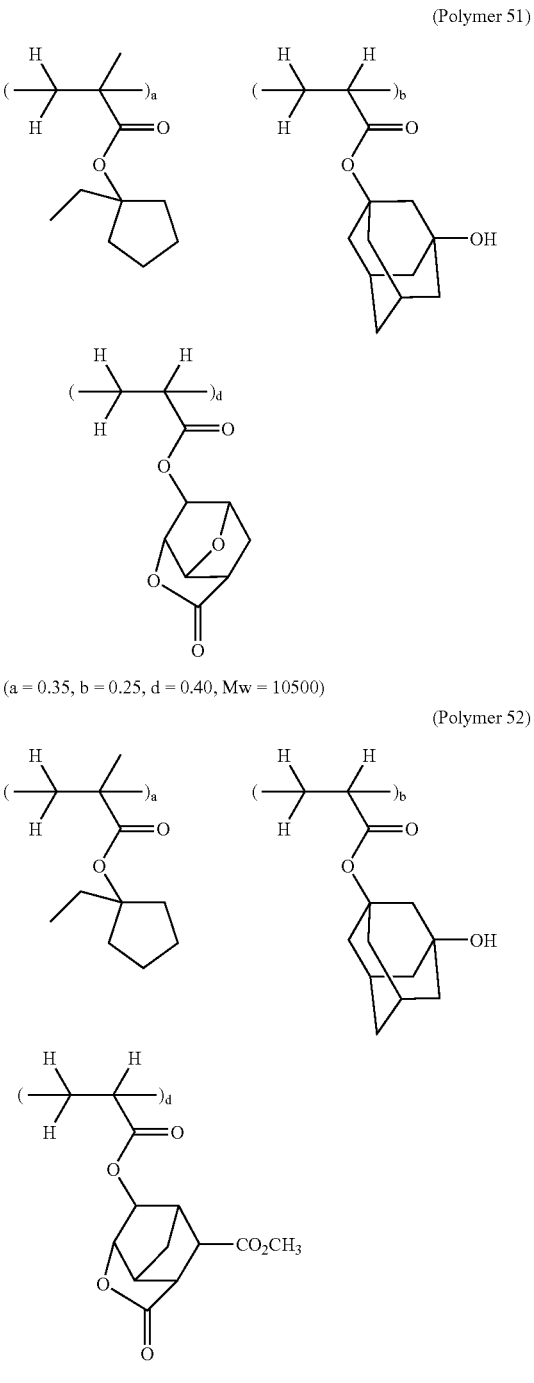

Synthesis Example 51

Synthesis of Polymer 51

In 150 g of methyl ethyl ketone were dissolved 15.68 g (86.0 mmol) of 1-ethyl-1-cyclopentyl methacrylate, 13.66 g (61.4 mmol) of 3-hydroxy-1-adamanthyl acrylate, 20.66 g (98.3 mmol) of 4,8-dioxa-5-oxotricyclo[4.2.1.0$^{3,7}$]nonane-2-yl acrylate, and 1.70 g (7.37 mmol) of dimethyl-2,2'-azobis(2-methylpropionate). Under a nitrogen gas stream, the resulting solution was added dropwise in 4 hours to 50 g of methyl ethyl ketone heated to 80° C. After completion of the dropwise addition, the reaction mixture was stirred under heating at 80° C. for 2 hours under a nitrogen gas stream. After completion of the reaction, the reaction mixture was cooled to room temperature. The resulting reaction mixture was added dropwise to 1.5 L of hexane under vigorous stirring to cause precipitation. The solid thus obtained was filtered, and dried under vacuum at 50° C. for 15 hours, whereby 39.3 g of a white solid was obtained in a yield of 78.6%. As a result of GPC and $^{13}$C NMR analysis, the resulting white solid was confirmed to be a polymer represented by formula of Polymer 51 below. The Mw means a weight-average molecular weight of the polymer based on measurement of GPC using polystyrene as a standard.

Synthesis Examples 52 to 64

Synthesis of Polymers 52 to 64

In a similar manner to Synthesis Example 51 or in a known manner, Polymers 52 to 64 were synthesized.

-continued
(Polymer 53)
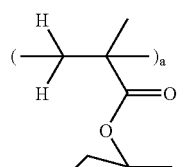 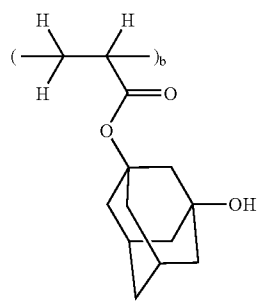
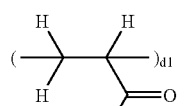
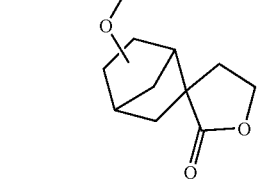
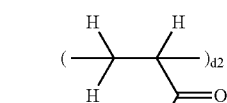
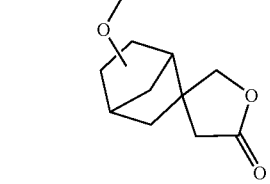
(a = 0.35, b = 0.25, d1 + d2 = 0.40, Mw = 10500)
(Polymer 54)
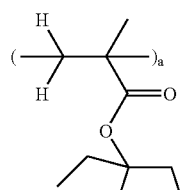 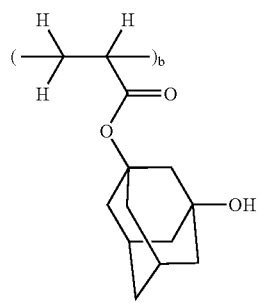
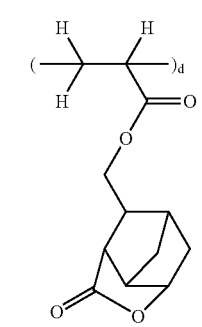
(a = 0.35, b = 0.25, d = 0.40, Mw = 10100)
(Polymer 55)
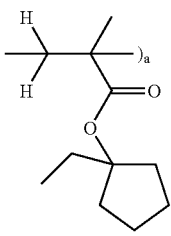 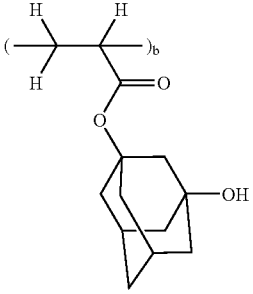
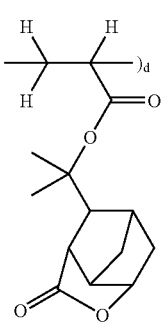
(a = 0.35, b = 0.25, d = 0.40, Mw = 9500)
(Polymer 56)
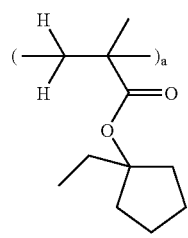 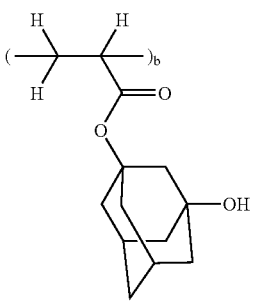
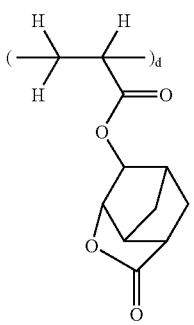
(a = 0.35, b = 0.25, d = 0.40, Mw = 9900)

(Polymer 57)
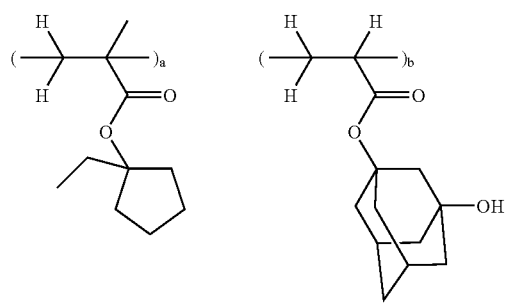
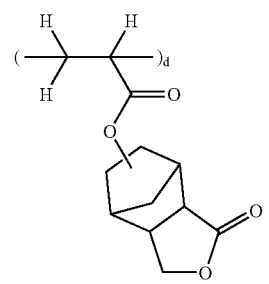
(a = 0.35, b = 0.25, d = 0.40, Mw = 9600)
(Polymer 58)
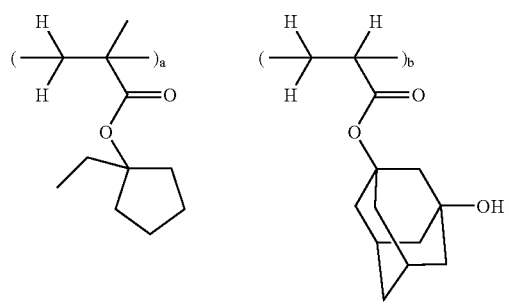
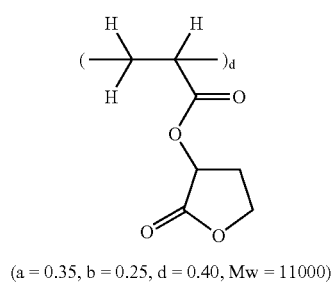
(a = 0.35, b = 0.25, d = 0.40, Mw = 11000)
(Polymer 59)
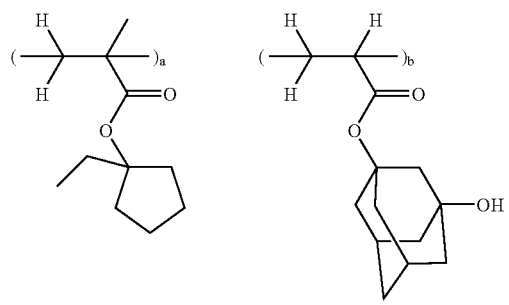
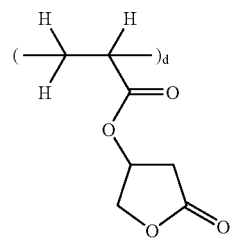
(a = 0.35, b = 0.25, d = 0.40, Mw = 10800)
(Polymer 60)
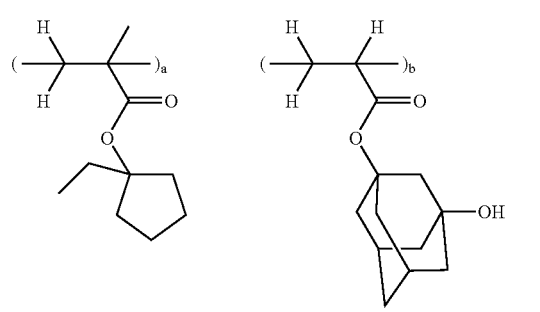
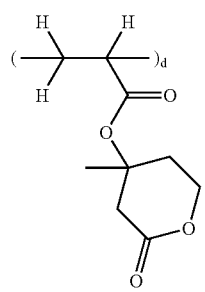
(a = 0.35, b = 0.25, d = 0.40, Mw = 10000)
(Polymer 61)
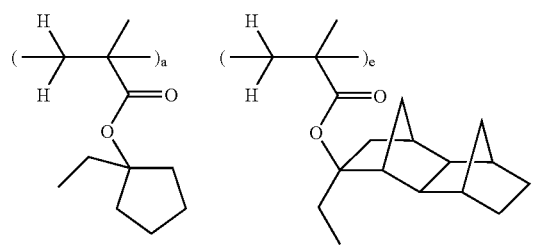
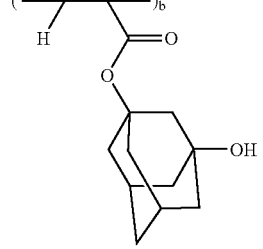
(a = 0.30, e = 10, b = 0.25, d = 0.35, Mw = 9300)

-continued (Polymer 62)

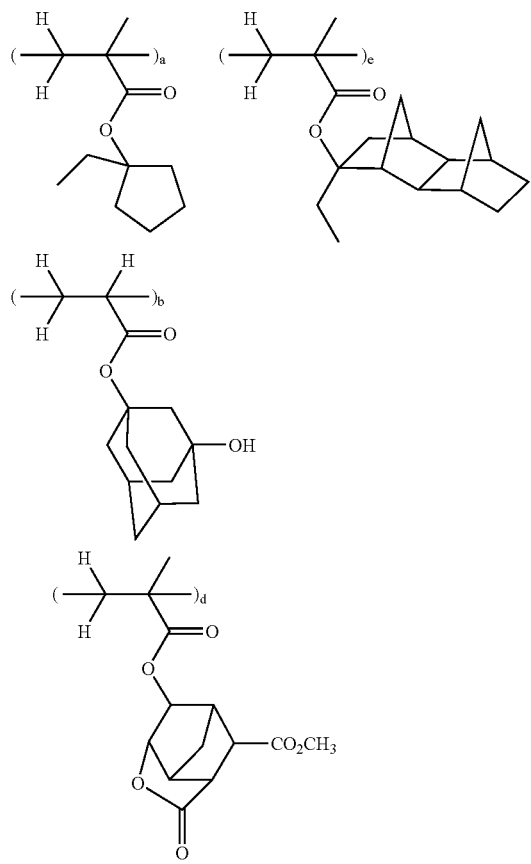

(a = 0.30, e = 10, b = 0.25, d = 0.35, Mw = 8900)

(Polymer 63)

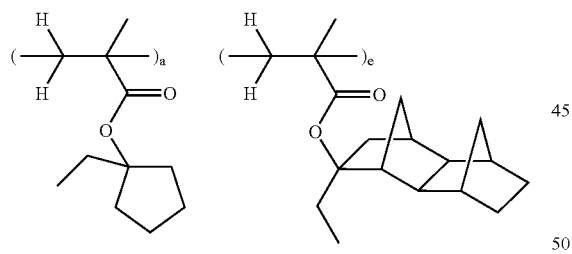

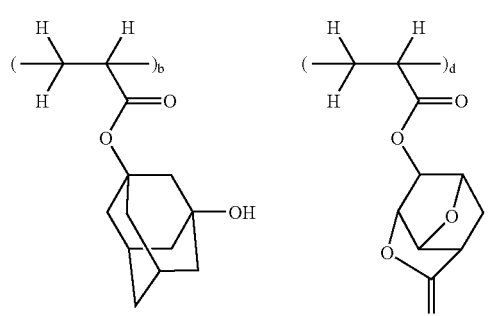

(a = 0.30, e = 10, b = 0.25, d = 0.35, Mw = 10600)

-continued (Polymer 64)

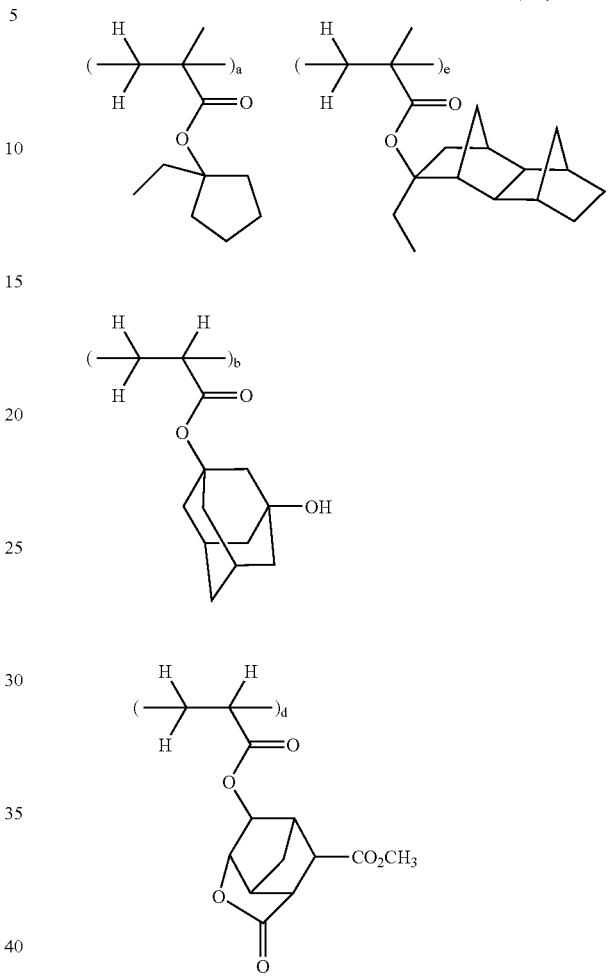

(a = 0.30, e = 10, b = 0.25, d = 0.35, Mw = 10100)

EXAMPLES

The resolution of the resist material comprising the polymer of the invention as a base resin was evaluated.

Examples 1 to 64 and Comparative Examples 65 to 73

Each of the polymers (Polymers 1 to 64) represented by formulas above and polymers (Polymers 65 to 73) represented by formulas below for comparison as a base resin, an acid generator, a basic compound and a solvent were mixed according to the composition as shown in Table 1. By filtering the mixture thus obtained through a Teflon (trademark) filter (pore size: 0.2 μm), a resist material was obtained.

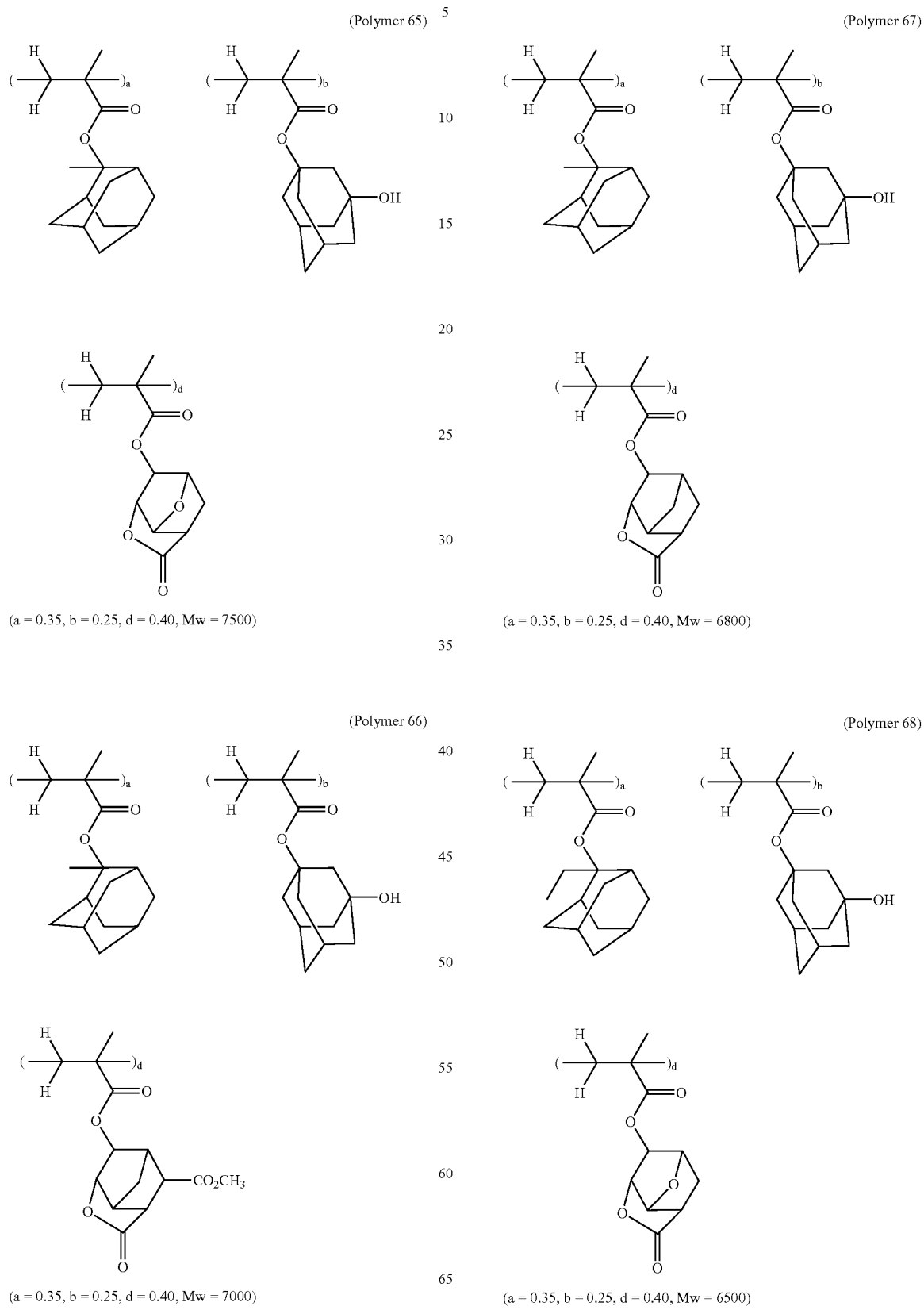

(Polymer 69)
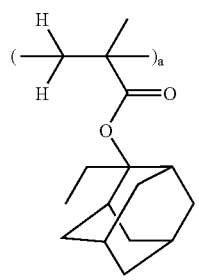
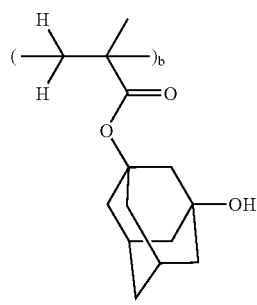
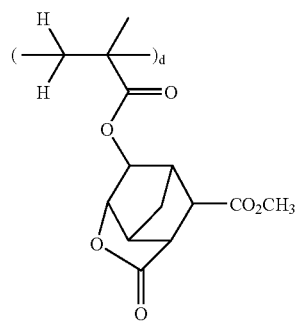
(a = 0.35, b = 0.25, d = 0.40, Mw = 5300)
(Polymer 70)
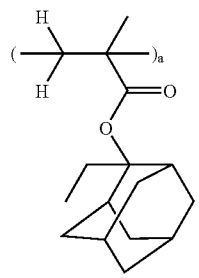
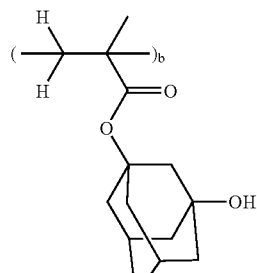
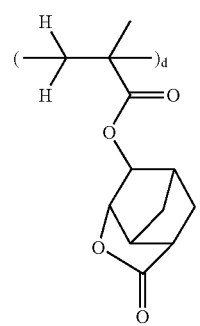
(a = 0.35, b = 0.25, d = 0.40, Mw = 7100)
(Polymer 71)
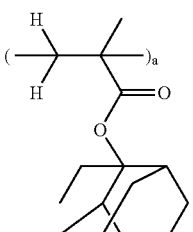
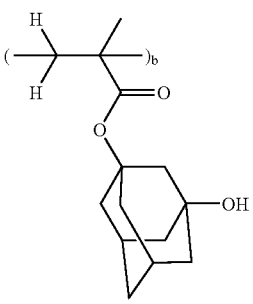
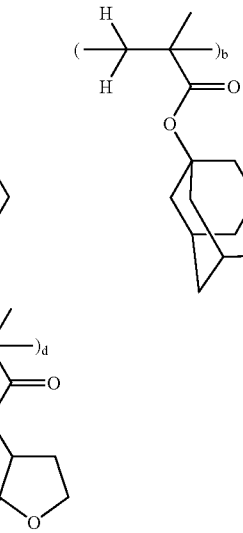
(a = 0.35, b = 0.25, d = 0.40, Mw = 6900)
(Polymer 72)
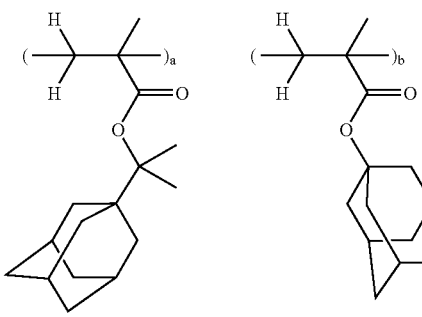
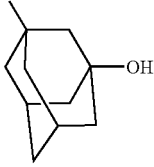
(a = 0.35, b = 0.25, d = 0.40, Mw = 8000)
(Polymer 73)
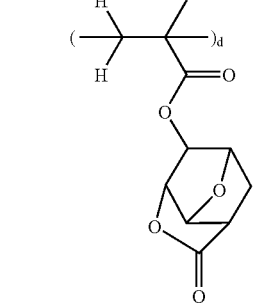
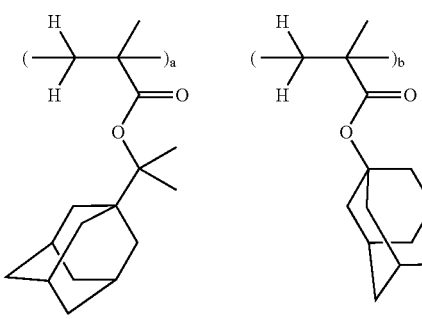
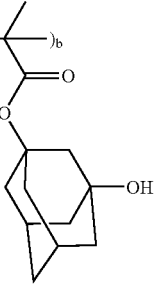

-continued

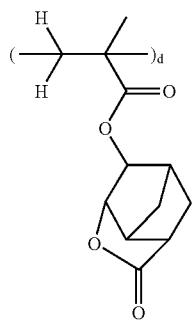

(a = 0.35, b = 0.25, d = 0.40, Mw = 7800)

The resulting resist solution was spin-coated onto a silicon wafer having an antireflection film ("ARC29A", product of Nissan Chemical Co., Ltd., thickness: 78 nm) applied thereto and was heat-treated at 130° C. for 60 seconds, whereby a resist film of 300 nm thick was formed. The resist film was exposed using an ArF excimer laser stepper (product of Nikon Corporation, NA=0.68). After heat treatment at from 100 to 130° C. for 60 seconds, the film was puddle-developed with a 2.38 wt % aqueous solution of tetramethylammonium hydroxide for 60 seconds, whereby 1:1 line-and-space patterns were formed. The wafers as developed were sectioned and observed with sectional SEM (scanning electron microscope). The minimum line width (μm) of the line-and-space patterns which were separated at the exposure dose (optimum exposure dose=Eop, mJ/cm$^2$) for providing a 1:1 resolution of a 0.13 μm line-and-space pattern was defined as the resolution of the resist to be evaluated. The shape of the resist pattern at this time was classified into rectangular, rounded head, T-top, forward taper or reverse taper. In addition, the roughness of the side walls was observed and the resist film was rated "good" or "poor" according to the degree of smoothness.

The composition and evaluation results of each resist of Examples are shown in Tables 1 and 2. The composition and evaluation results of each resist of Comparative Examples are shown in Table 3. In Tables 1 to 3, photoacid generator, basic compound and solvents used are as follows. It is to be noted that all the solvents used in these examples contained 0.01 wt % of "KH-20" (product of Asahi Glass Co., Ltd.).

TPSNf: triphenylsulfonium nonafluorobutanesulfonate
TMMEA: trismethoxymethoxyethylamine
PGMEA: propylene glycol methyl ether acetate
CyHO: cyclohexanone From the results in Tables 1 to 3, it has been confirmed that the resist materials of the invention are excellent in sensitivity, resolution and solubility in solvent, and are free from side-wall roughness, when exposed to ArF excimer laser light.

TABLE 1

| Example | resin (wt part) | acid generator (wt part) | basic compound (wt part) | solvent (wt part) | PEB temp. (° C.) | optimum exposure dose (mJ/cm$^2$) | resolution (nm) | shape | side-wall roughness |
|---|---|---|---|---|---|---|---|---|---|
| 1 | Polymer1 (80) | TPSNF (2.18) | TMMEA (0.472) | PGMEA (640) | 120 | 24.0 | 0.11 | rectan. | good |
| 2 | Polymer2 (80) | TPSNF (2.18) | TMMEA (0.472) | PGMEA (640) | 120 | 25.0 | 0.11 | rectan. | good |
| 3 | Polymer3 (80) | TPSNF (2.18) | TMMEA (0.472) | PGMEA (640) | 120 | 25.0 | 0.11 | rectan. | good |
| 4 | Polymer4 (80) | TPSNF (2.18) | TMMEA (0.472) | PGMEA (640) | 120 | 24.0 | 0.11 | rectan. | good |
| 5 | Polymer5 (80) | TPSNF (2.18) | TMMEA (0.472) | PGMEA (640) | 120 | 24.0 | 0.12 | rectan. | good |
| 6 | Polymer6 (80) | TPSNF (2.18) | TMMEA (0.472) | PGMEA (640) | 120 | 25.0 | 0.11 | rectan. | good |
| 7 | Polymer7 (80) | TPSNF (2.18) | TMMEA (0.472) | PGMEA (640) | 120 | 26.0 | 0.12 | rectan. | good |
| 8 | Polymer8 (80) | TPSNF (2.18) | TMMEA (0.472) | PGMEA (640) | 120 | 23.0 | 0.11 | rectan. | good |
| 9 | Polymer9 (80) | TPSNF (2.18) | TMMEA (0.472) | PGMEA (640) | 120 | 22.0 | 0.11 | rectan. | good |
| 10 | Polymer10 (80) | TPSNF (2.18) | TMMEA (0.472) | PGMEA (640) | 120 | 23.0 | 0.11 | rectan. | good |
| 11 | Polymer11 (80) | TPSNF (2.18) | TMMEA (0.472) | PGMEA (640) | 120 | 25.0 | 0.12 | rectan. | good |
| 12 | Polymer12 (80) | TPSNF (2.18) | TMMEA (0.472) | PGMEA (640) | 120 | 25.0 | 0.12 | rectan. | good |
| 13 | Polymer13 (80) | TPSNF (2.18) | TMMEA (0.472) | PGMEA (640) | 120 | 26.0 | 0.12 | rectan. | good |
| 14 | Polymer16 (80) | TPSNF (2.18) | TMMEA (0.472) | PGMEA (640) | 130 | 23.0 | 0.11 | rectan. | good |
| 15 | Polymer17 (80) | TPSNF (2.18) | TMMEA (0.472) | PGMEA (640) | 130 | 25.0 | 0.12 | rectan. | good |
| 16 | Polymer18 (80) | TPSNF (2.18) | TMMEA (0.472) | PGMEA (640) | 130 | 23.0 | 0.12 | rectan. | good |
| 17 | Polymer19 (80) | TPSNF (2.18) | TMMEA (0.472) | PGMEA (640) | 120 | 22.0 | 0.12 | rectan. | good |
| 18 | Polymer20 (80) | TPSNF (2.18) | TMMEA (0.472) | PGMEA (640) | 120 | 23.0 | 0.12 | rectan. | good |

TABLE 2

| Example | resin (wt part) | acid generator (wt part) | basic compound (wt part) | solvent (wt part) | PEB temp. (° C.) | optimum exposure dose (mJ/cm$^2$) | resolution (nm) | shape | side-wall roughness |
|---|---|---|---|---|---|---|---|---|---|
| 19 | Polymer21 (80) | TPSNF (2.18) | TMMEA (0.472) | PGMEA (640) | 120 | 23.0 | 0.12 | rectan. | good |
| 20 | Polymer22 (80) | TPSNF (2.18) | TMMEA (0.472) | PGMEA (640) | 130 | 24.0 | 0.12 | rectan. | good |
| 21 | Polymer23 (80) | TPSNF (2.18) | TMMEA (0.472) | PGMEA (640) | 120 | 26.0 | 0.12 | rectan. | good |
| 22 | Polymer24 (80) | TPSNF (2.18) | TMMEA (0.472) | PGMEA (640) | 110 | 21.0 | 0.12 | rectan. | good |
| 23 | Polymer25 (80) | TPSNF (2.18) | TMMEA (0.472) | PGMEA (640) | 120 | 21.0 | 0.11 | rectan. | good |
| 24 | Polymer27 (80) | TPSNF (2.18) | TMMEA (0.472) | PGMEA (640) | 120 | 22.0 | 0.12 | rectan. | good |
| 25 | Polymer29 (80) | TPSNF (2.18) | TMMEA (0.472) | PGMEA (640) | 110 | 20.0 | 0.12 | rectan. | good |
| 26 | Polymer31 (80) | TPSNF (2.18) | TMMEA (0.472) | PGMEA (640) | 110 | 19.0 | 0.12 | rectan. | good |
| 27 | Polymer33 (80) | TPSNF (2.18) | TMMEA (0.472) | PGMEA (640) | 120 | 22.0 | 0.11 | rectan. | good |
| 28 | Polymer37 (80) | TPSNF (2.18) | TMMEA (0.472) | PGMEA (640) | 120 | 21.0 | 0.12 | rectan. | good |
| 29 | Polymer41 (80) | TPSNF (2.18) | TMMEA (0.472) | PGMEA (640) | 110 | 23.0 | 0.11 | rectan. | good |
| 30 | Polymer44 (80) | TPSNF (2.18) | TMMEA (0.472) | PGMEA (640) | 110 | 26.0 | 0.13 | rectan. | good |
| 31 | Polymer46 (80) | TPSNF (2.18) | TMMEA (0.472) | PGMEA (640) | 110 | 21.0 | 0.12 | rectan. | good |
| 32 | Polymer47 (80) | TPSNF (2.18) | TMMEA (0.472) | PGMEA (640) | 110 | 22.0 | 0.12 | rectan. | good |
| 33 | Polymer51 (80) | TPSNF (2.18) | TMMEA (0.472) | PGMEA (640) | 100 | 20.0 | 0.12 | rectan. | good |
| 34 | Polymer52 (80) | TPSNF (2.18) | TMMEA (0.472) | PGMEA (640) | 100 | 19.0 | 0.12 | rectan. | good |
| 35 | Polymer61 (80) | TPSNF (2.18) | TMMEA (0.472) | PGMEA (640) | 110 | 20.0 | 0.12 | rectan. | good |
| 36 | Polymer63 (80) | TPSNF (2.18) | TMMEA (0.472) | PGMEA (640) | 100 | 18.0 | 0.13 | rectan. | good |

TABLE 3

| Compar. Example | resin (wt part) | acid generator (wt part) | basic compound (wt part) | solvent (wt part) | PEB temp. (° C.) | optimum exposure dose (mJ/cm$^2$) | resolution (nm) | shape | side-wall roughness |
|---|---|---|---|---|---|---|---|---|---|
| 1 | Polymer65 (80) | TPSNF (2.18) | TMMEA (0.472) | CyHo (720) | 130 | 26.0 | 0.13 | T-top | poor |
| 2 | Polymer66 (80) | TPSNF (2.18) | TMMEA (0.472) | CyHo (720) | 130 | 25.0 | 0.14 | T-top | poor |
| 3 | Polymer67 (80) | TPSNF (2.18) | TMMEA (0.472) | CyHo (720) | 130 | 28.0 | 0.14 | T-top | poor |
| 4 | Polymer68 (80) | TPSNF (2.18) | TMMEA (0.472) | CyHo (720) | 120 | 24.0 | 0.13 | rectan. | poor |
| 5 | Polymer69 (80) | TPSNF (2.18) | TMMEA (0.472) | CyHo (720) | 120 | 24.0 | 0.14 | T-top | poor |
| 6 | Polymer70 (80) | TPSNF (2.18) | TMMEA (0.472) | CyHo (720) | 120 | 25.0 | 0.13 | T-top | poor |
| 7 | Polymer71 (80) | TPSNF (2.18) | TMMEA (0.472) | CyHo (720) | 120 | 25.0 | 0.13 | rounded head | poor |
| 8 | Polymer72 (80) | TPSNF (2.18) | TMMEA (0.472) | CyHo (720) | 120 | 24.0 | 0.14 | T-top | poor |
| 9 | Polymer73 (80) | TPSNF (2.18) | TMMEA (0.472) | CyHo (720) | 120 | 24.0 | 0.14 | T-top | poor |

The invention claimed is:

1. A polymer having a weight-average molecular weight of 1,000 to 50,000 and comprising at least one repeating unit of formula (1), at least one repeating unit of formula (2) and at least one repeating unit of formula (3) wherein formulas (1) to (3) are as follows:

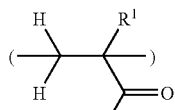
(1)

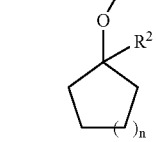
(2)

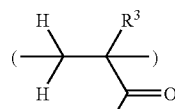
(3)

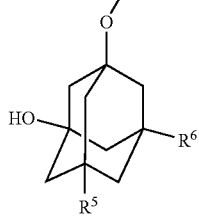

wherein $R^1$, $R^3$ and $R^4$ each independently represents a hydrogen atom or a methyl group; $R^2$ represents a linear, branched or cyclic $C_{1-12}$ alkyl group; $R^5$ and $R^6$ each independently represents a hydrogen atom or a hydroxyl group; X represents a substituent containing a lactone structure; and n stands for 1 or 2, wherein said formula (3) is selected from one or more formulas (3-1) to (3-7):

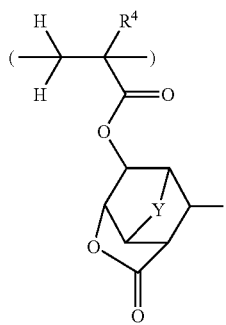
(3-1)

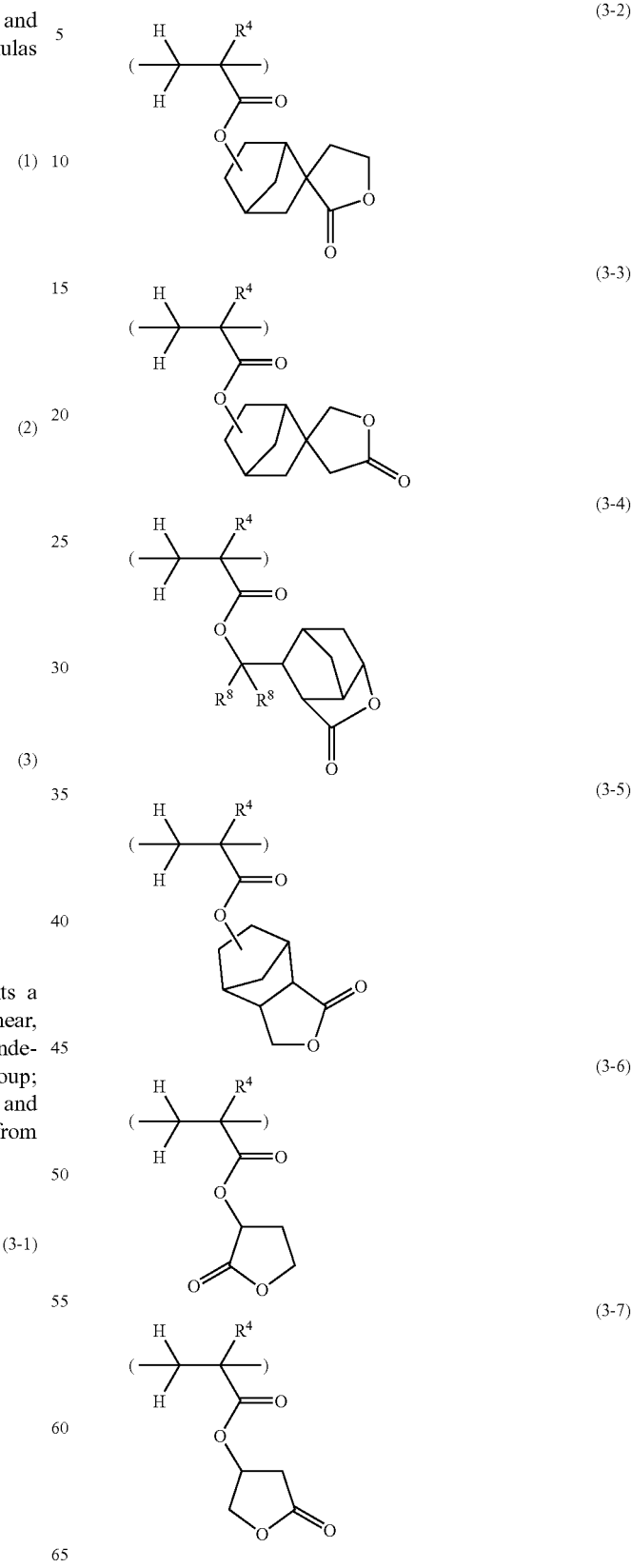

wherein $R^7$ represents a hydrogen atom or $CO_2R^9$ in which $R^9$ represents a linear, branched or cyclic monovalent $C_{1-8}$ hydrocarbon group; $R^8$ represents a hydrogen atom or a linear, branched or cyclic monovalent $C_{1-10}$ hydrocarbon group or $R^8$s may be coupled to form a ring, together with a carbon atom to which the $R^8$s are attached; and Y represents a methylene group or oxygen atom.

2. A resist material comprising the polymer of claim 1.

3. A process for forming a pattern, comprising steps of:
applying the resist material of claim 2 onto a substrate to form a film,
heating the film,
exposing the heated film through a photomask to high energy radiation or electron beam,
heating the exposed film, and
developing the film with a developer.

4. A process for forming a pattern, comprising steps of:
applying the polymer of claim 1 onto a substrate to form a film,
heating the film,
exposing the heated film through a photomask to high energy radiation or electron beam,
heating the exposed film, and
developing the film with a developer.

5. The polymer of claim 1, wherein said formula (3) is selected from one or more formulas (3-1) to (3-5).

6. The polymer of claim 5, wherein said formula (3) is selected from one or more formulas (3-1) and (3-4).

7. The polymer of claim 6, wherein said formula (3) is (3-1).

* * * * *

UNITED STATES PATENT AND TRADEMARK OFFICE
CERTIFICATE OF CORRECTION

PATENT NO. : 7,157,207 B2
APPLICATION NO. : 10/933013
DATED : January 2, 2007
INVENTOR(S) : Kenji Funatsu, Tsunehiro Nishi and Shigehiro Nagura It is certified that error appears in the above-identified patent and that said Letters Patent is hereby corrected as shown below:

Column 24, line 64, after "include" insert the word -- the --.
Column 39, line 3, "stands" should read -- stand --.
Column 95, line 9, after "comprising" insert the word -- the --.
Column 96, line 1, after "comprising" insert the word -- the --.

Signed and Sealed this

Sixth Day of November, 2007

JON W. DUDAS
*Director of the United States Patent and Trademark Office*